(12) United States Patent
Tai et al.

(10) Patent No.: US 12,218,213 B2
(45) Date of Patent: Feb. 4, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: An-Hung Tai, Hsinchu County (TW); Jian-Hao Chen, Hsinchu (TW); Hui-Chi Chen, Zhudong Township, Hsinchu County (TW); Kuo-Feng Yu, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 394 days.

(21) Appl. No.: 17/677,390

(22) Filed: Feb. 22, 2022

(65) Prior Publication Data

US 2023/0268408 A1 Aug. 24, 2023

(51) Int. Cl.
*H01L 29/423* (2006.01)
*H01L 29/06* (2006.01)
*H01L 29/40* (2006.01)
*H01L 29/417* (2006.01)
*H01L 29/786* (2006.01)

(52) U.S. Cl.
CPC .... *H01L 29/42392* (2013.01); *H01L 29/0665* (2013.01); *H01L 29/401* (2013.01); *H01L 29/41775* (2013.01); *H01L 29/78696* (2013.01)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0115256 A1* | 4/2019 | Wang ................ H01L 21/76829 |
| 2020/0035796 A1* | 1/2020 | Lee ................ H01L 21/823475 |
| 2020/0118873 A1* | 4/2020 | Tsai .................... H01L 29/0847 |
| 2020/0321279 A1* | 10/2020 | Su ..................... H01L 21/76879 |
| 2022/0190160 A1* | 6/2022 | Tang ................... H01L 29/0657 |

* cited by examiner

*Primary Examiner* — Khaja Ahmad
(74) *Attorney, Agent, or Firm* — McClure, Qualey & Rodack, LLP

(57) ABSTRACT

A semiconductor device structure is provided. The semiconductor device structure includes a substrate. The semiconductor device structure includes a gate stack over the substrate. The semiconductor device structure includes a cap layer over the gate stack. The semiconductor device structure includes a protective layer over the cap layer, wherein a lower portion of the protective layer extends into the cap layer. The semiconductor device structure includes a contact structure passing through the protective layer and the cap layer.

20 Claims, 27 Drawing Sheets

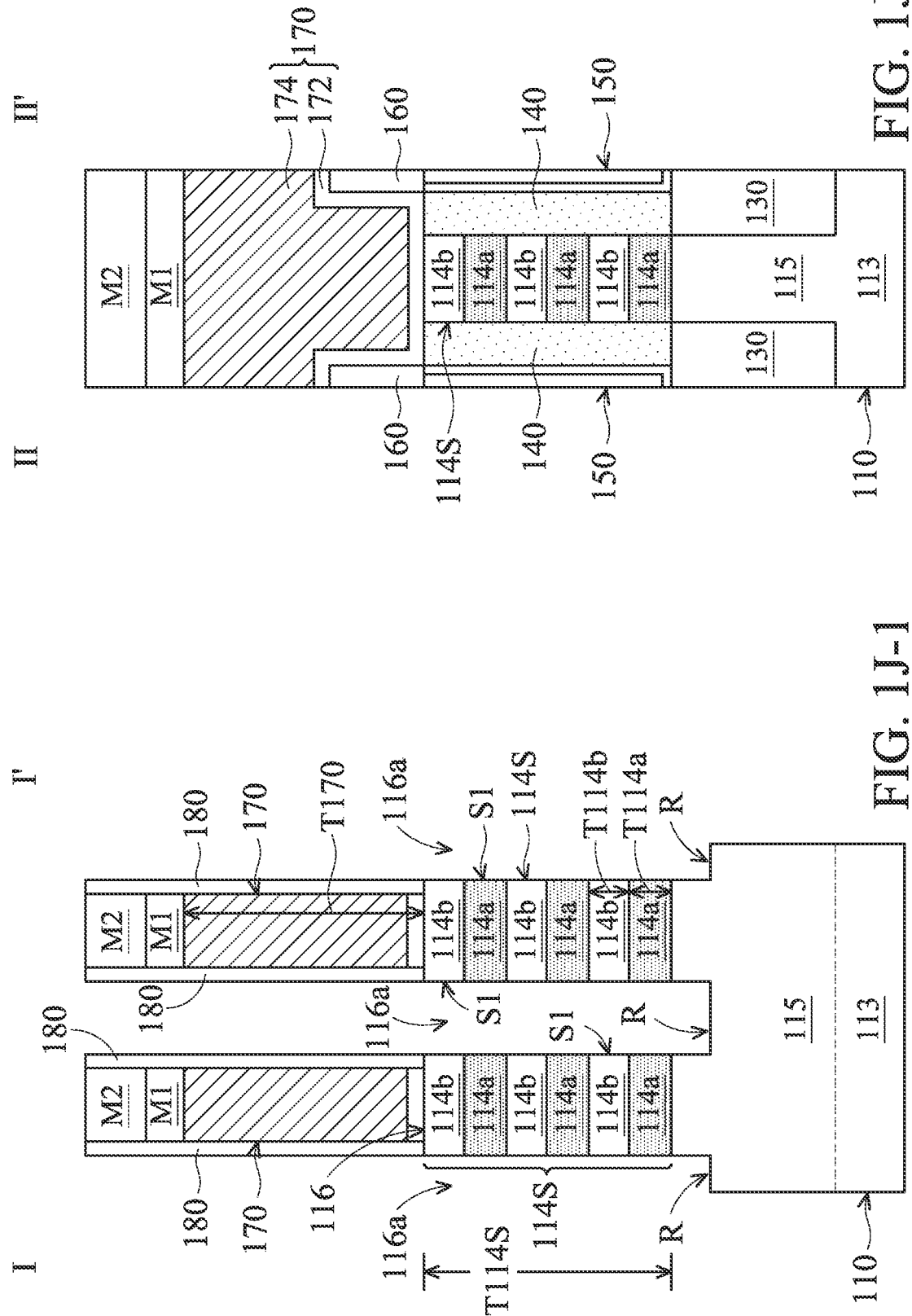

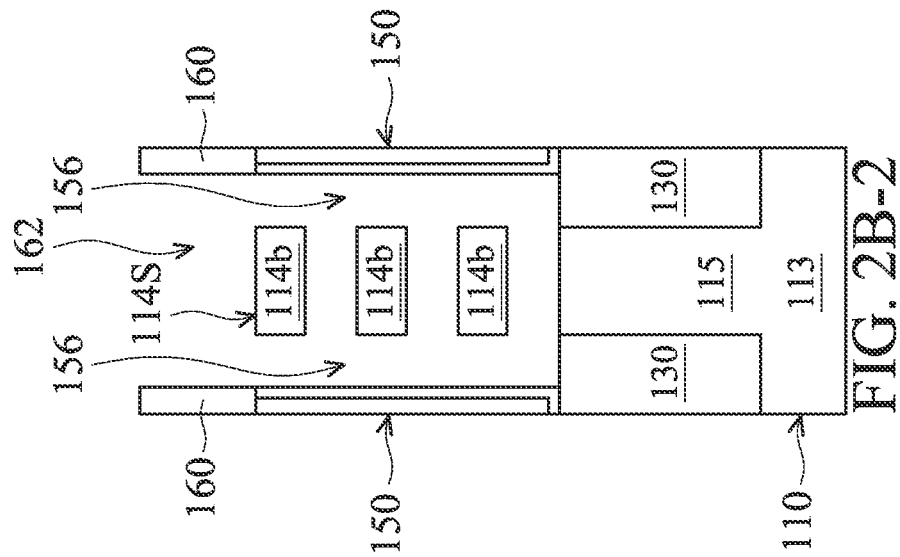
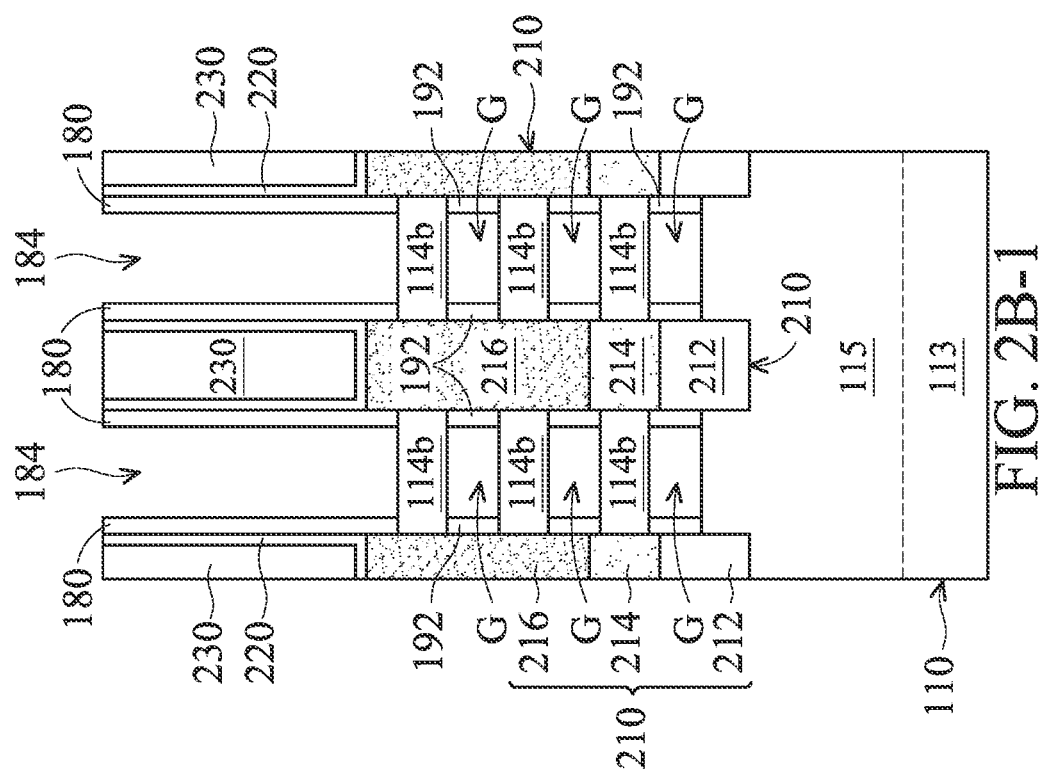

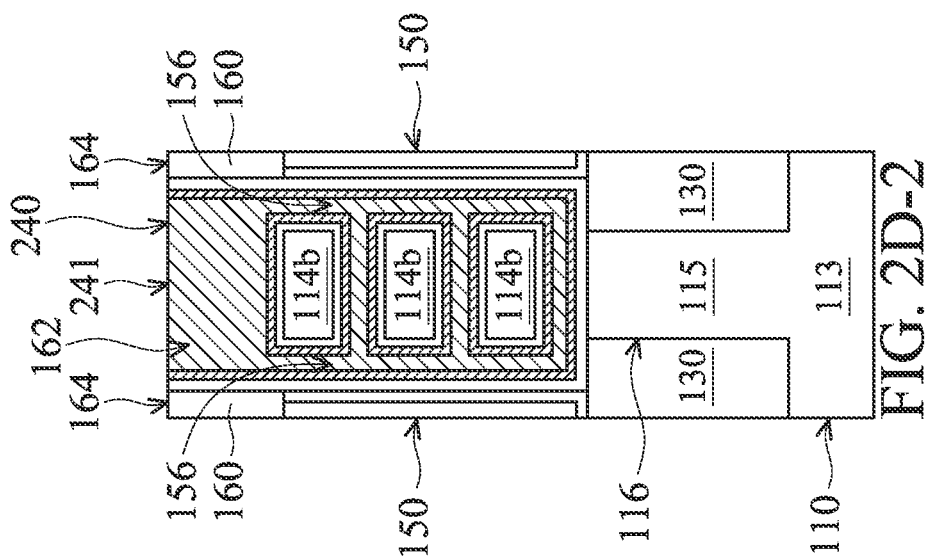
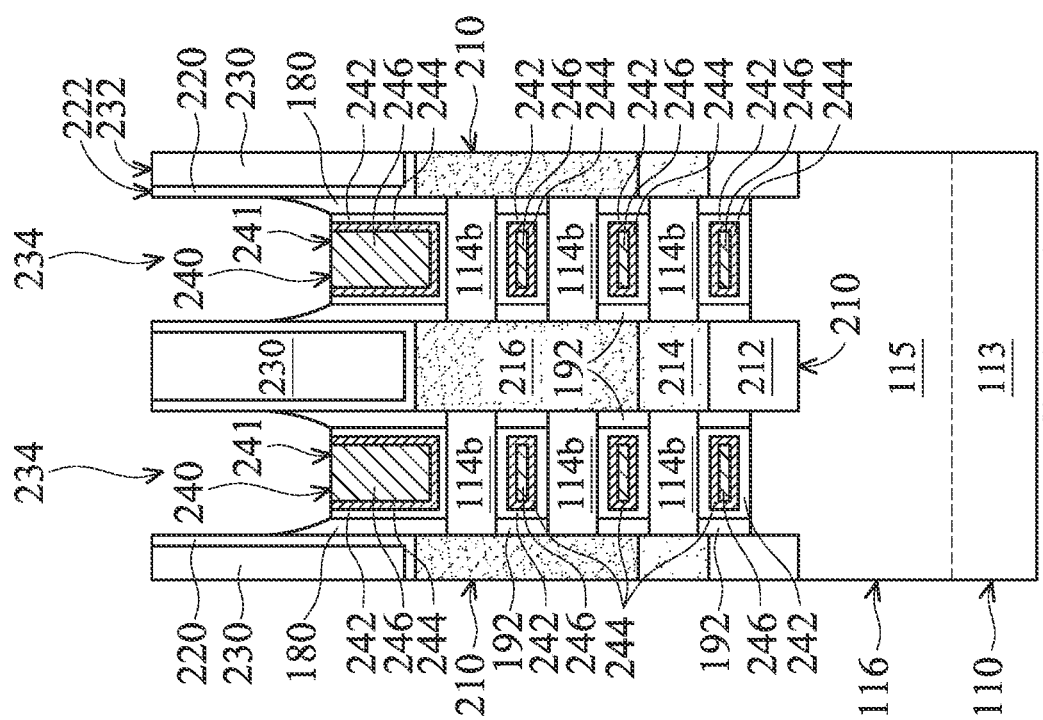

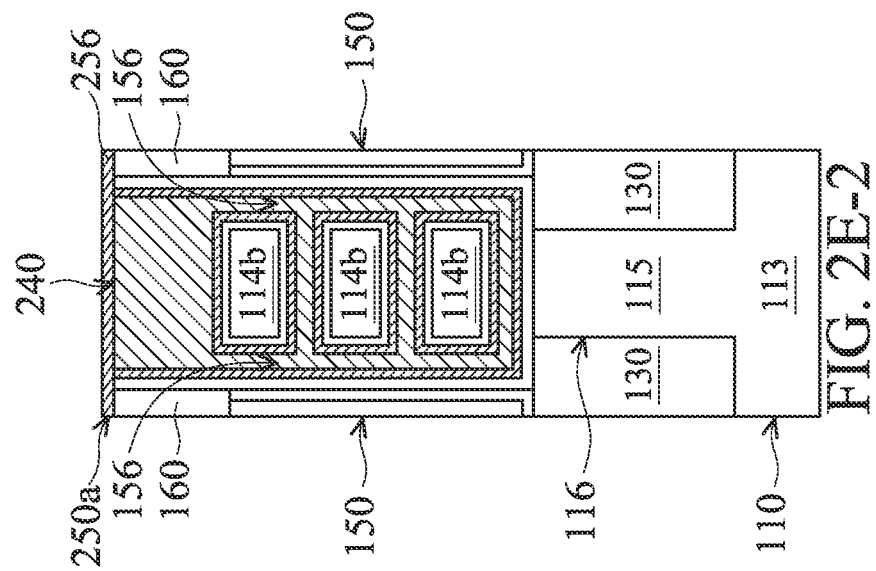
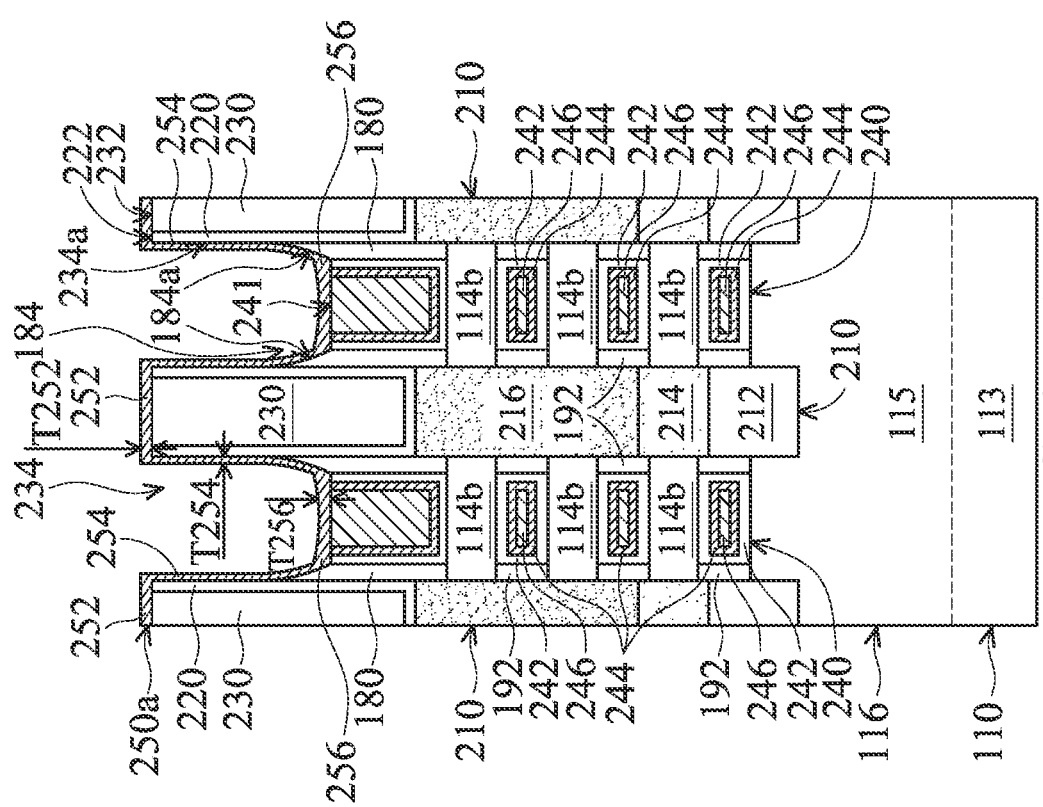

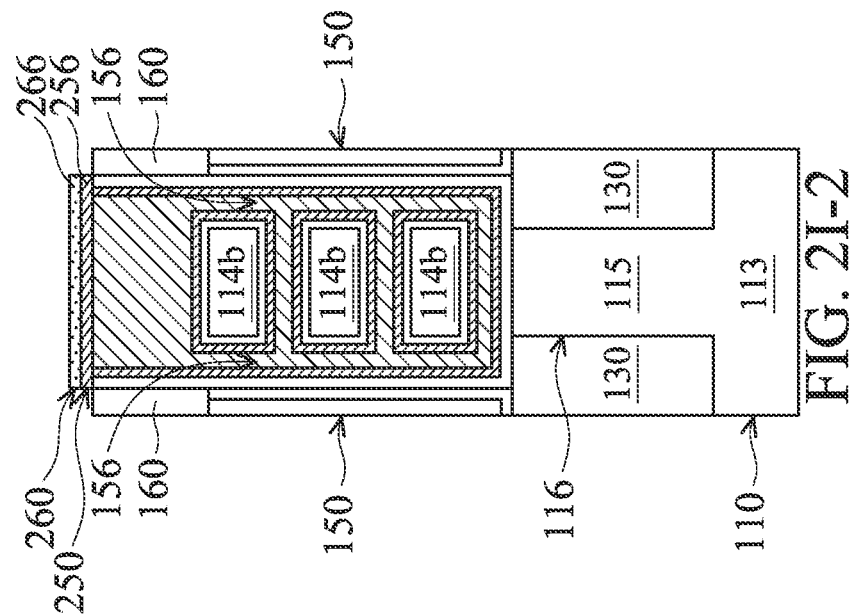
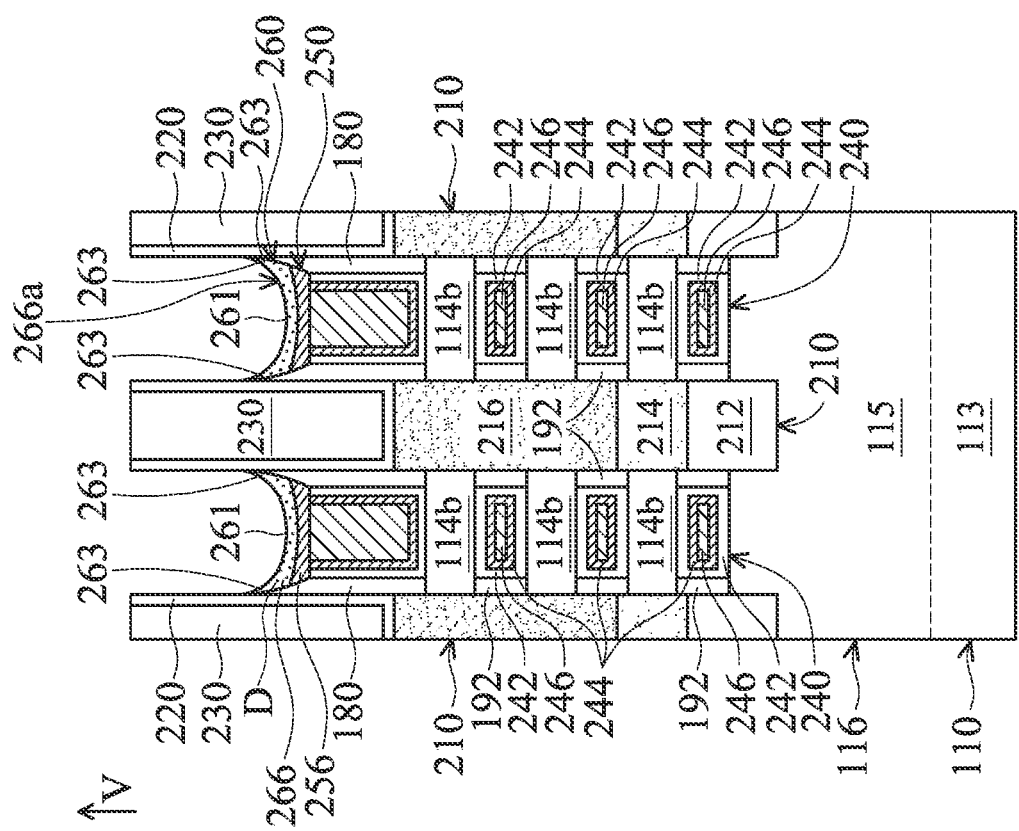
FIG. 2I-2
FIG. 2I-1

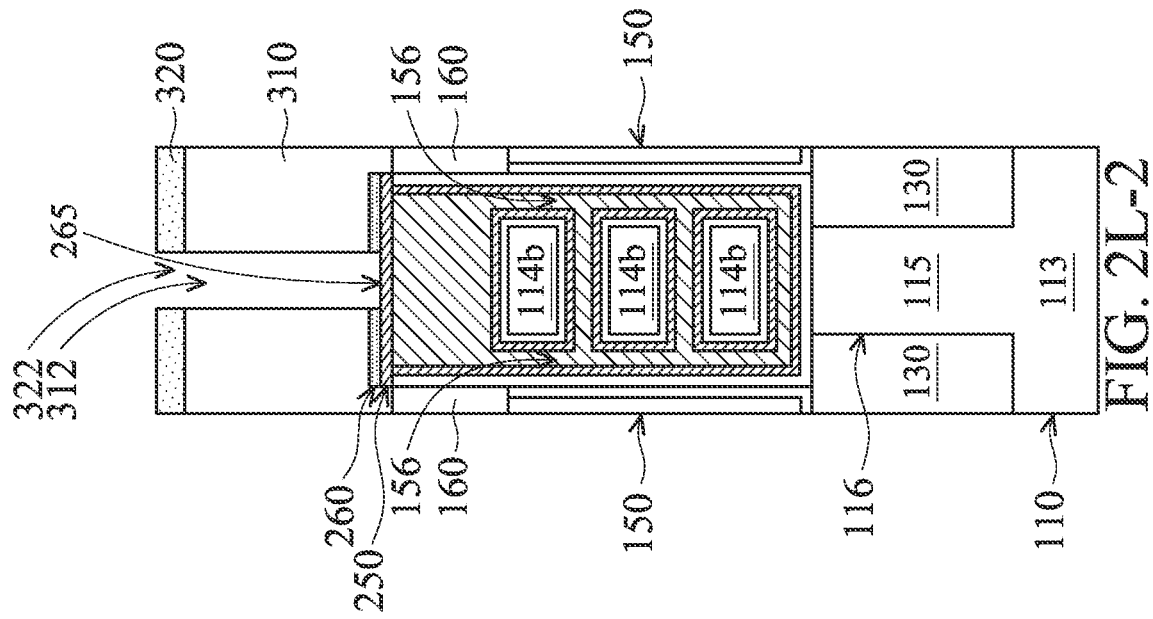
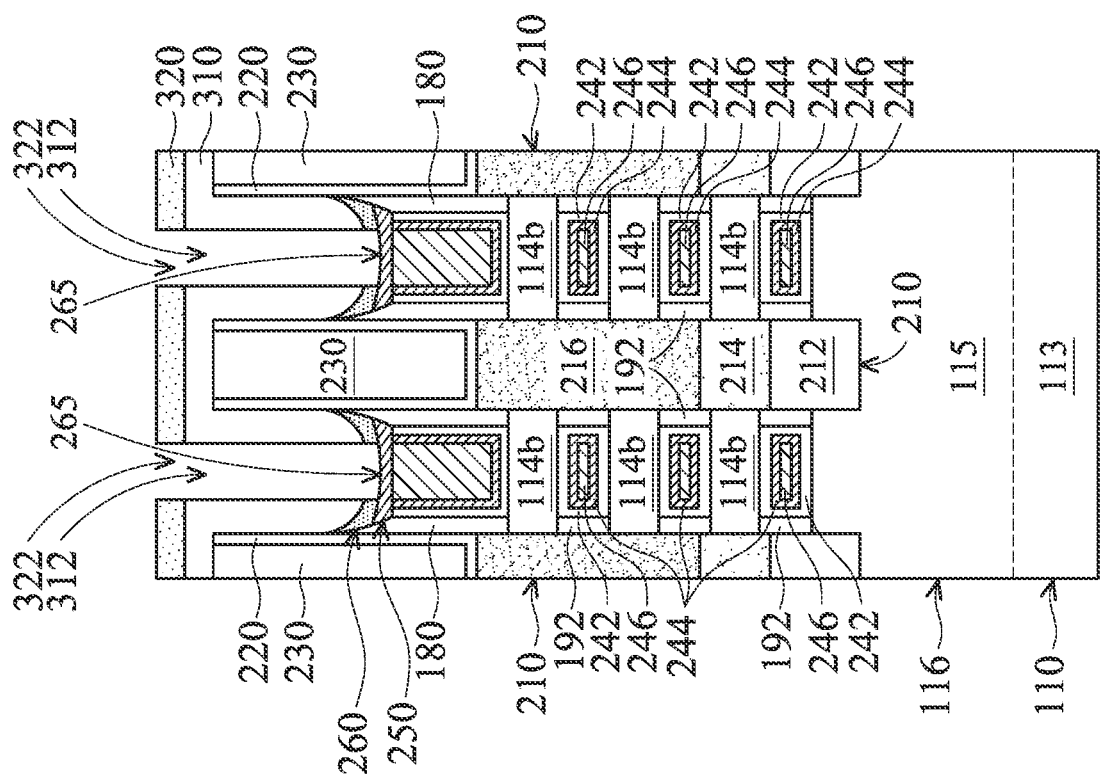
FIG. 2L-2
FIG. 2L-1

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1J-2 is a cross-sectional view illustrating the semiconductor device structure along a sectional line II-II' in FIG. 1J, in accordance with some embodiments.

FIGS. 2A-1 to 2N-1 are cross-sectional views of various stages of a process for forming a semiconductor device structure, in accordance with some embodiments.

FIGS. 2A-2 to 2N-2 are cross-sectional views of various stages of a process for forming a semiconductor device structure, in accordance with some embodiments.

DETAILED DESCRIPTION

Figure 1B:
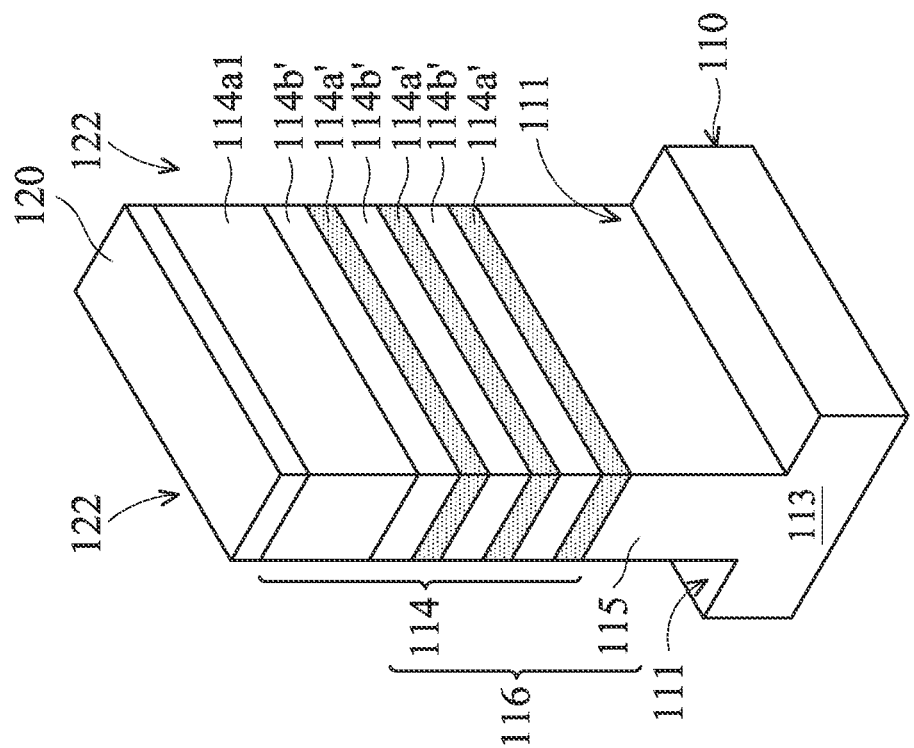
FIGS. 1A-1N are perspective views of various stages of a process for forming a semiconductor device structure, in accordance with some embodiments.
FIG. 1J-1 is a cross-sectional view illustrating the semiconductor device structure along a sectional line I-I' in FIG. 1J, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x ±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1A:
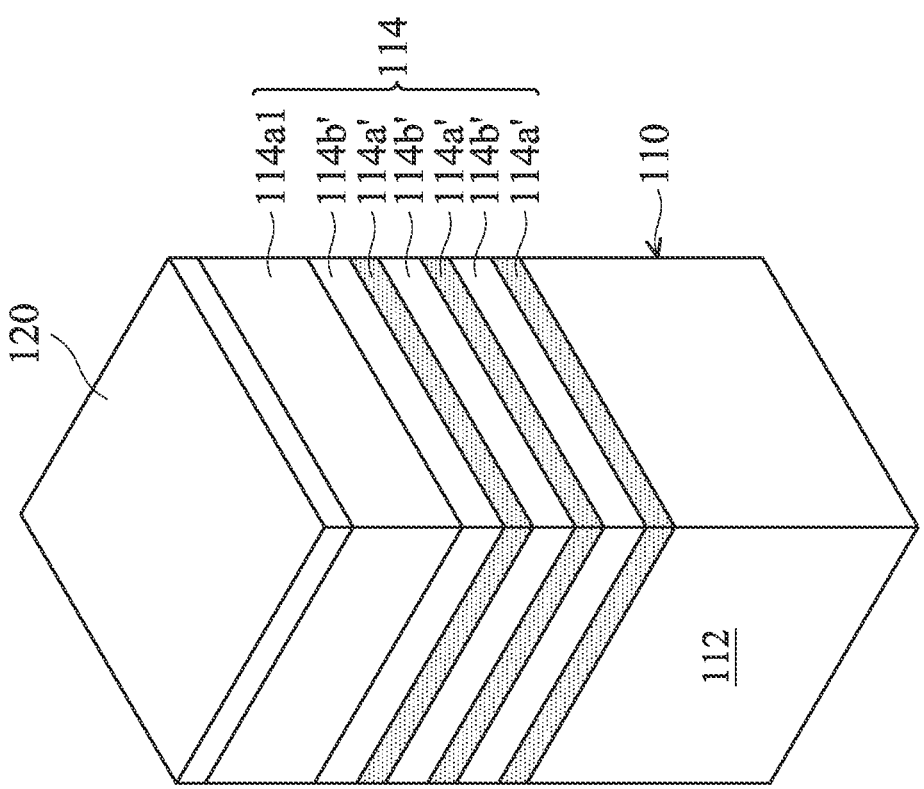
Figure 1D:
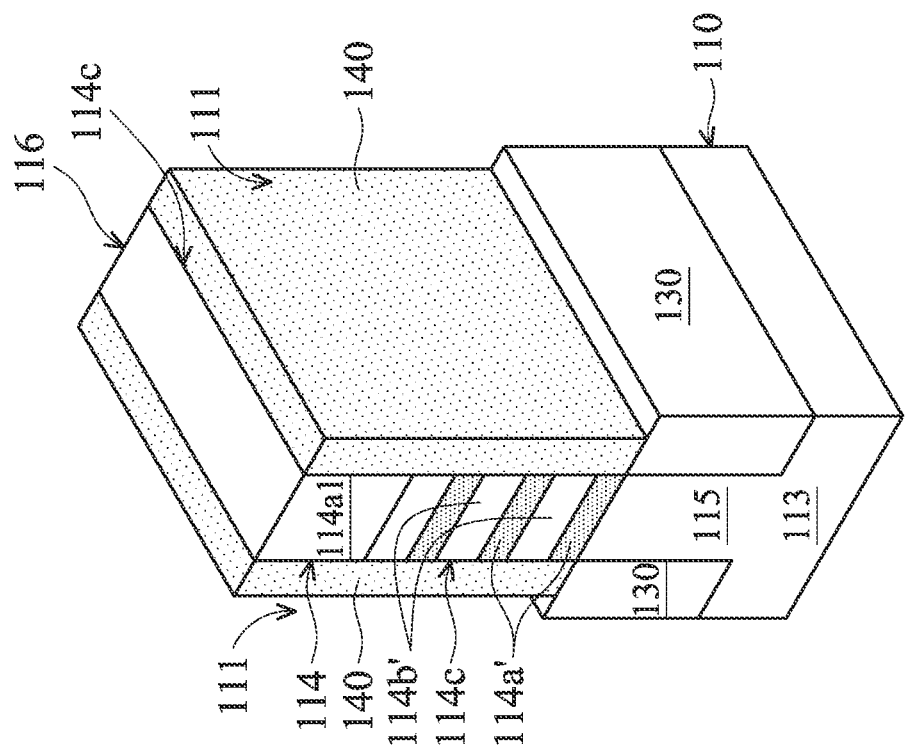
Figure 1C:
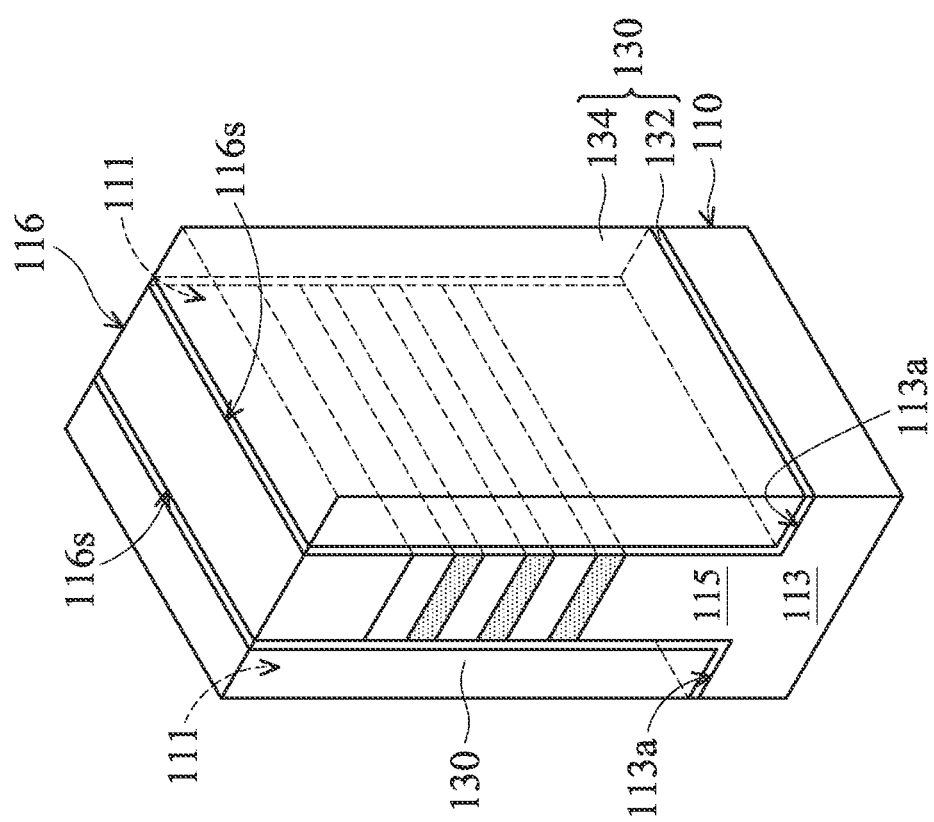
Figure 1E:
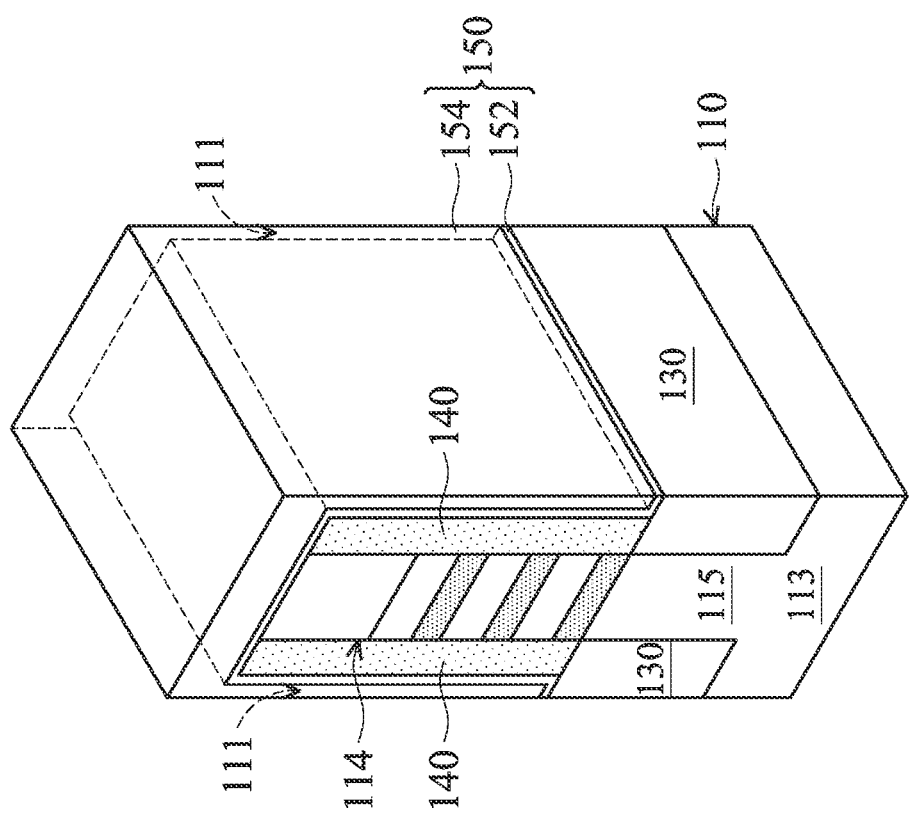
Figure 1F:
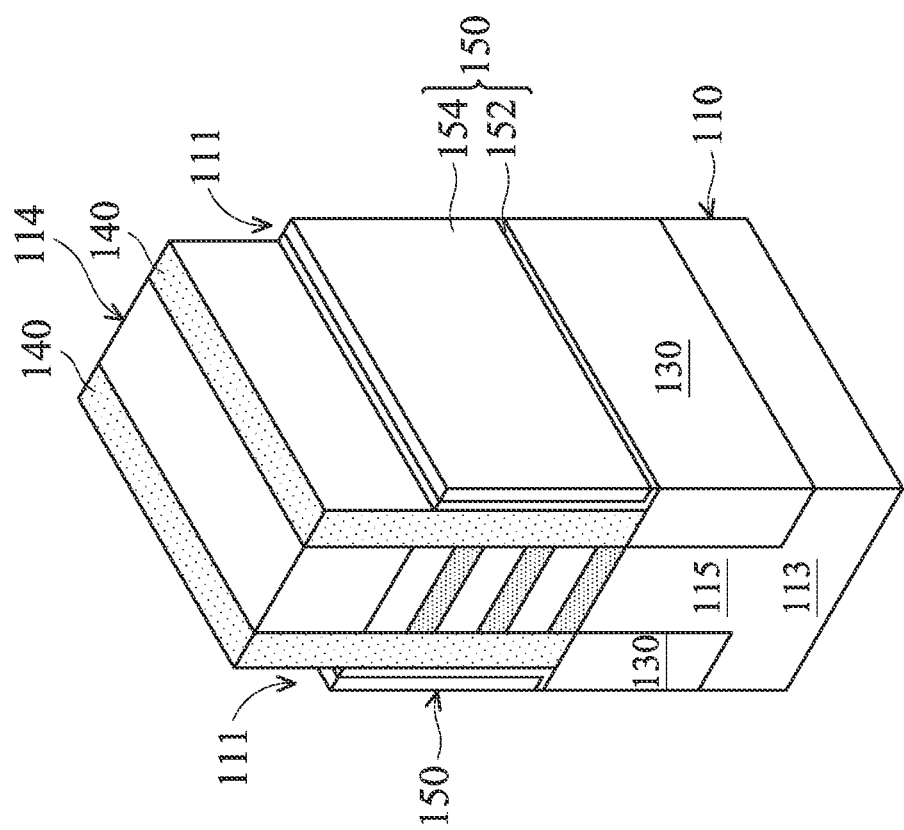
Figure 1G:
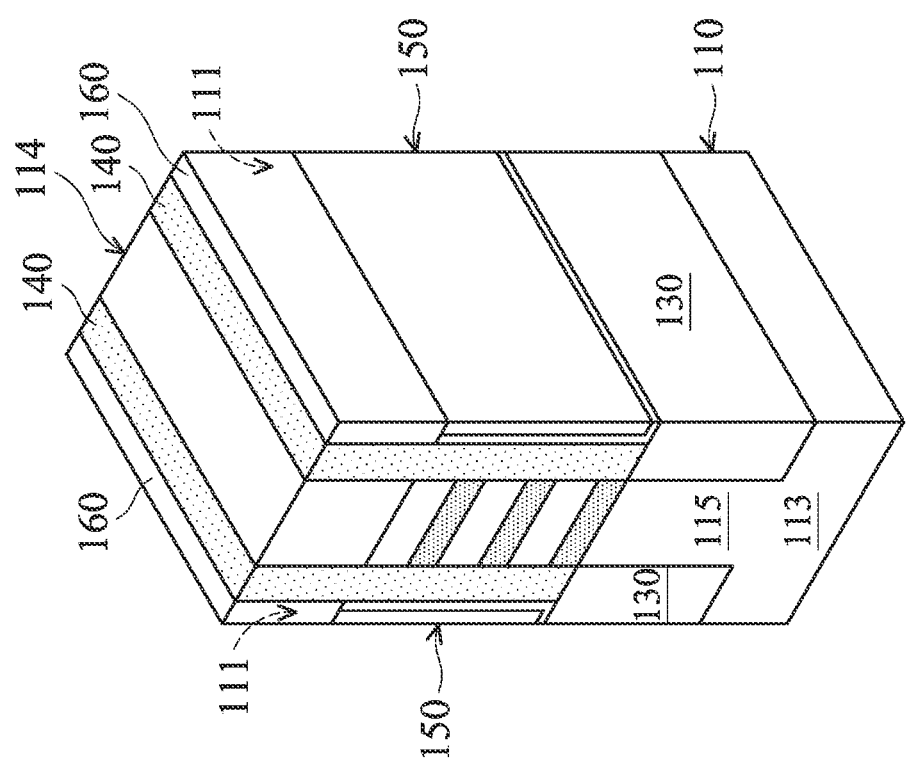
Figure 1H:
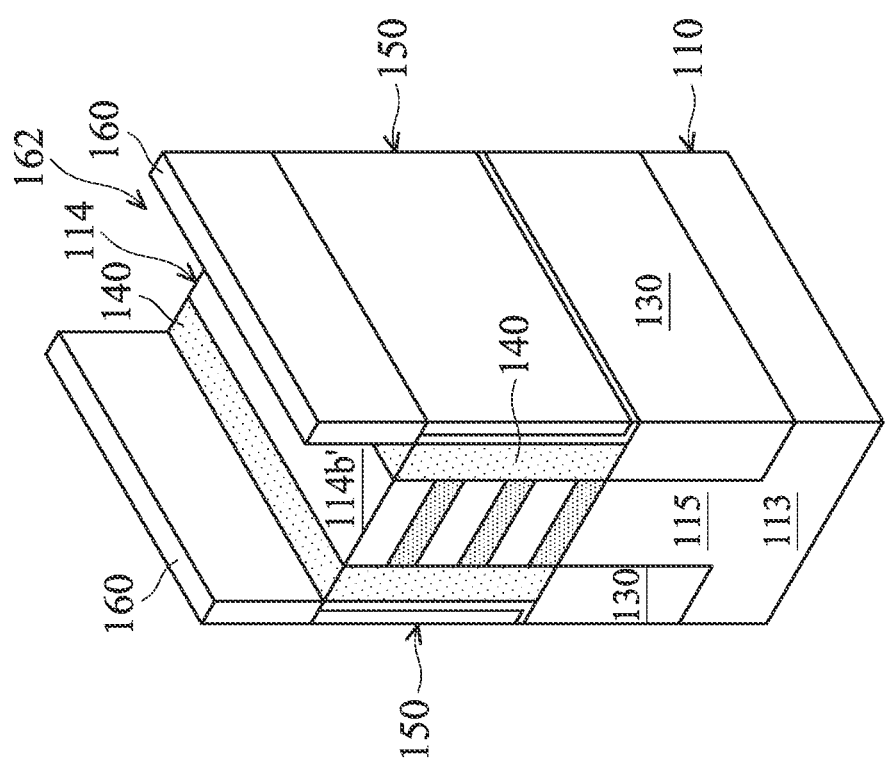
Figure 11:
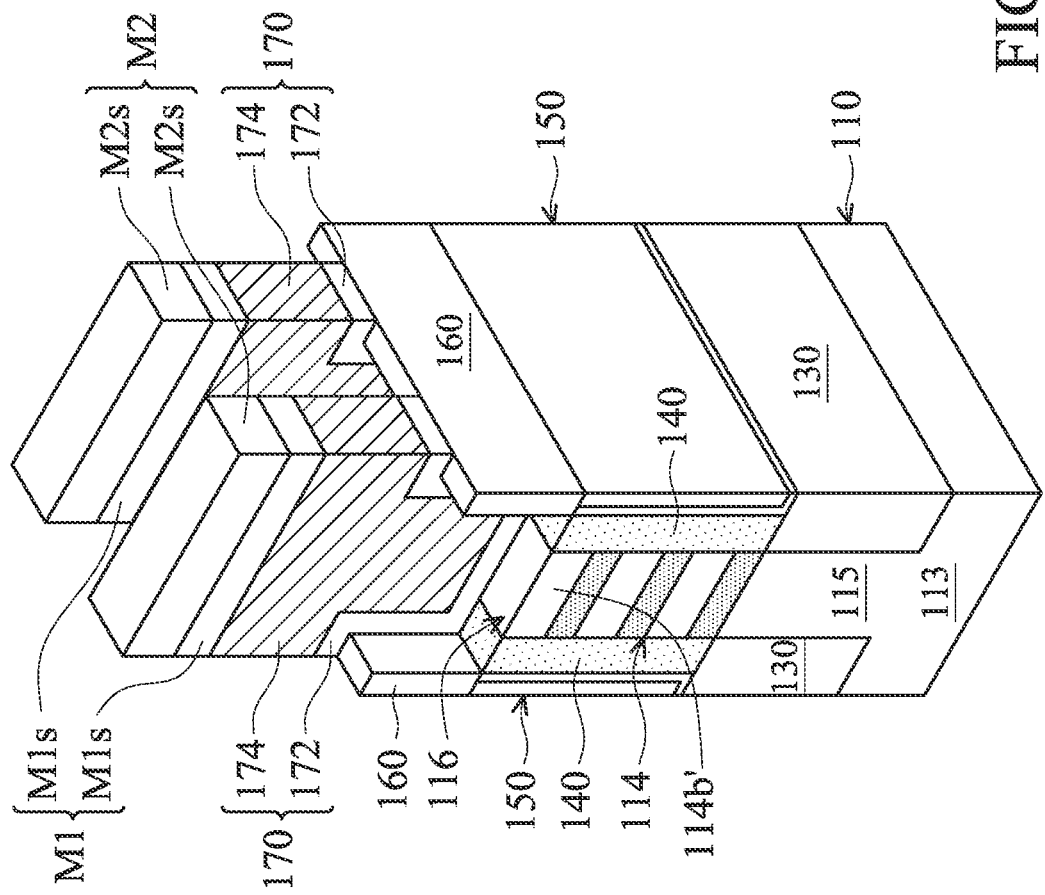
Figure 1J:
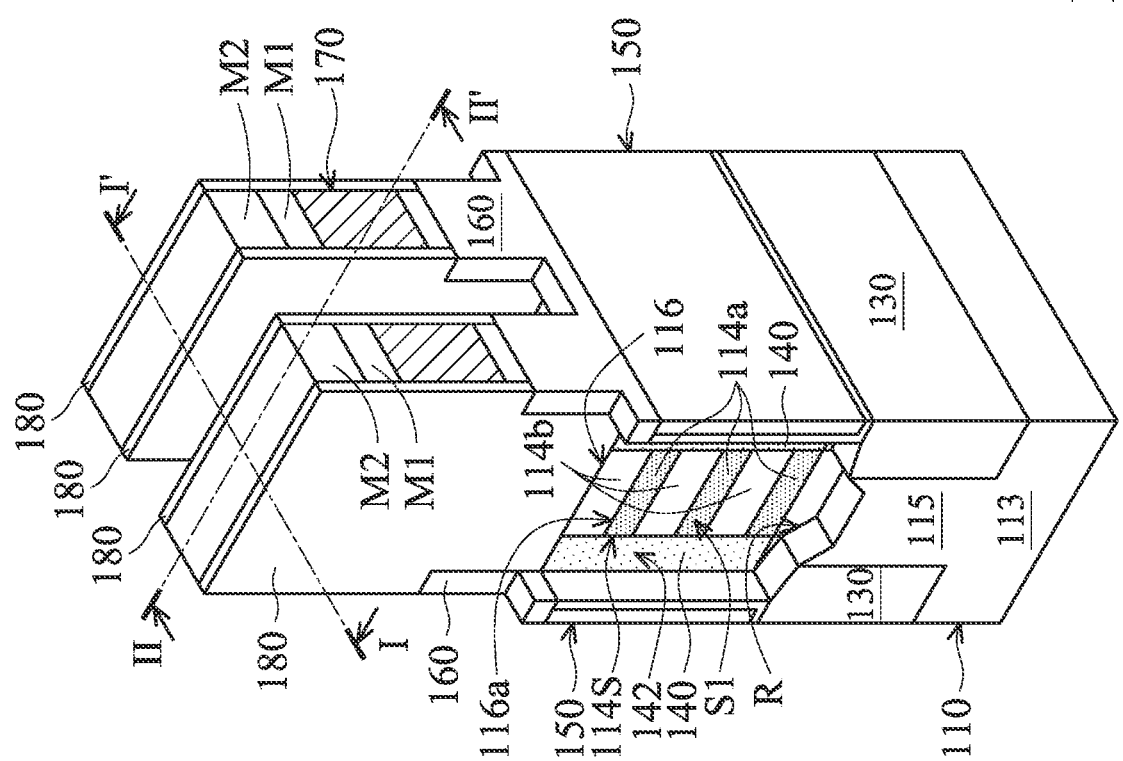
Figure 1K:
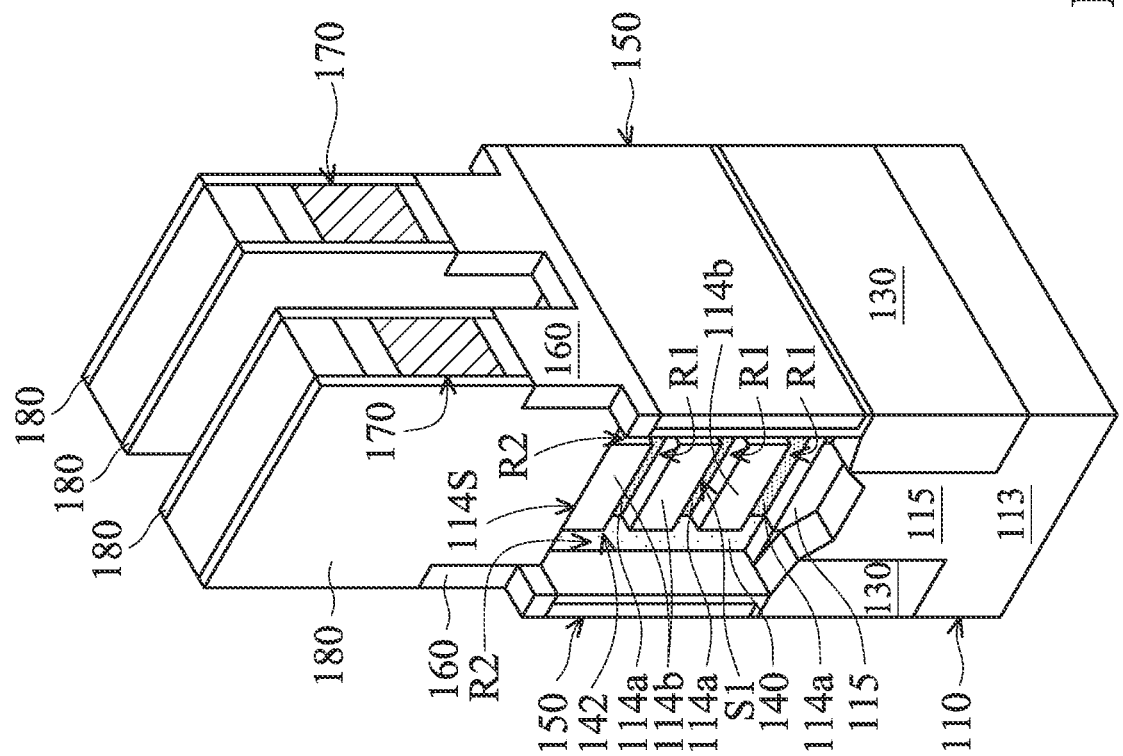
Figure 1L:
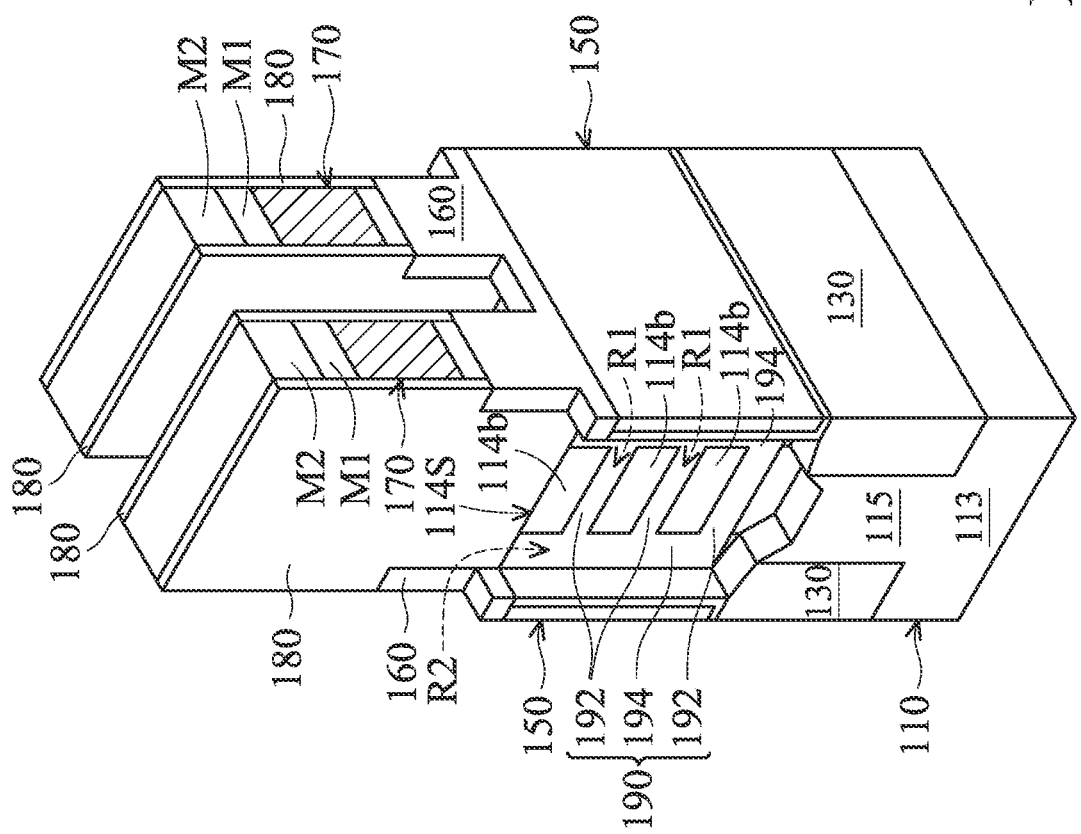
Figure 1M:
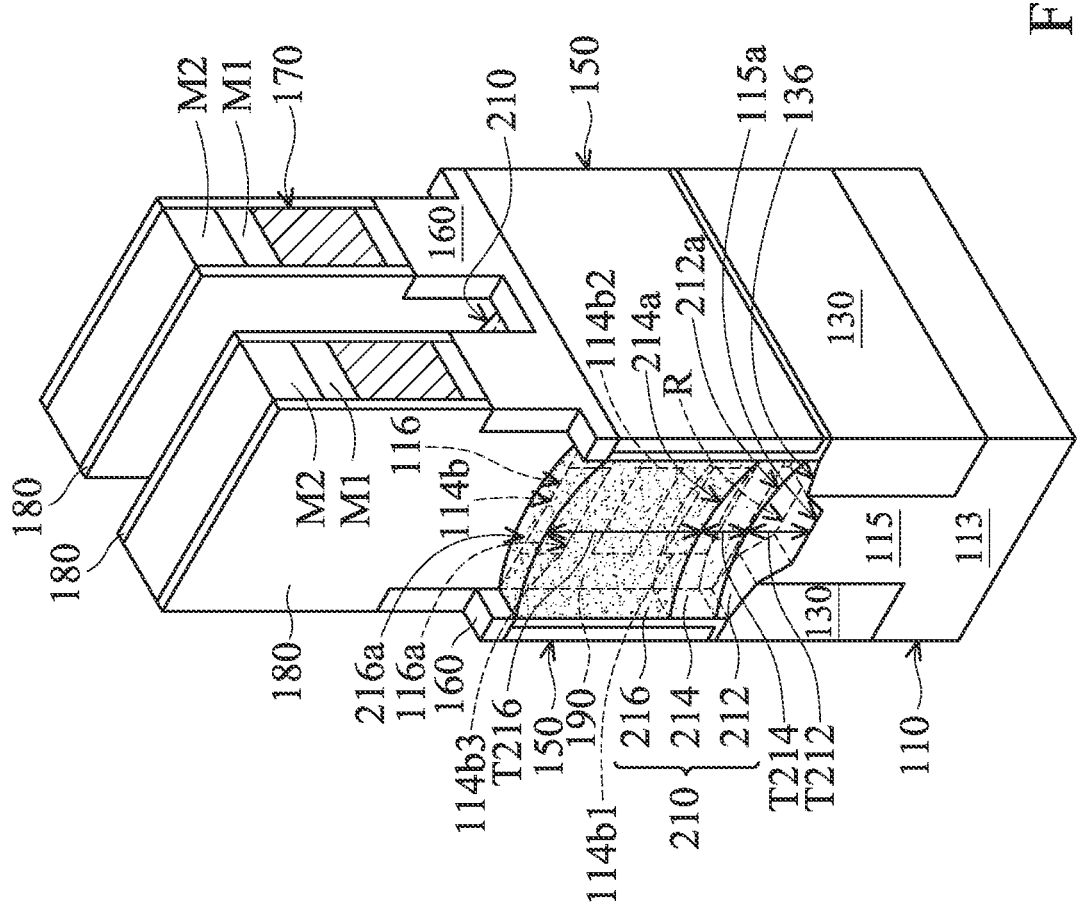
Figure 1N:
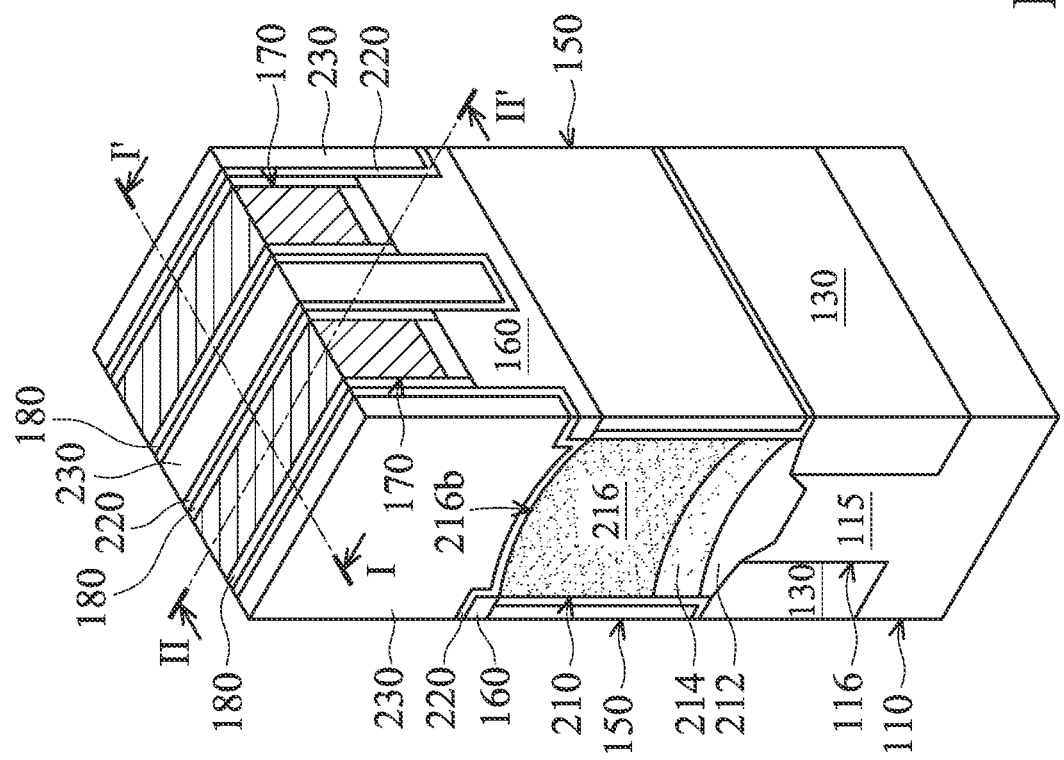

FIGS. 1A-1N are perspective views of various stages of a process for forming a semiconductor device structure, in accordance with some embodiments. As shown in FIG. 1A, a substrate 110 is provided, in accordance with some embodiments. The substrate 110 includes a lower portion 112 and a multilayer structure 114, in accordance with some embodiments. The multilayer structure 114 is formed over the lower portion 112, in accordance with some embodiments.

The lower portion 112 includes, for example, a semiconductor substrate. The semiconductor substrate includes, for example, a semiconductor wafer (such as a silicon wafer) or a portion of a semiconductor wafer. In some embodiments, the lower portion 112 is made of an elementary semiconductor material including silicon or germanium in a single crystal, polycrystal, or amorphous structure.

In some other embodiments, the lower portion 112 is made of a compound semiconductor, such as silicon carbide, gallium arsenide, gallium phosphide, indium phosphide, indium arsenide, an alloy semiconductor, such as SiGe, or GaAsP, or a combination thereof. The lower portion 112 may also include multi-layer semiconductors, semiconductor on insulator (SOI) (such as silicon on insulator or germanium on insulator), or a combination thereof.

In some embodiments, the lower portion 112 is a device wafer that includes various device elements. In some embodiments, the various device elements are formed in and/or over the lower portion 112. The device elements are not shown in figures for the purpose of simplicity and clarity.

Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the lower portion 112. The isolation features are used to define active regions and electrically isolate various device elements formed in and/or over the lower portion 112 in the active regions. In some embodiments, the isolation features include shallow trench isolation (STI) features, local oxidation of silicon (LOCOS) features, other suitable isolation features, or a combination thereof.

The multilayer structure 114 is also referred to a super lattice structure or a super lattice epitaxial growth structure, in accordance with some embodiments. The multilayer structure 114 includes sacrificial layers 114a', a thick sacrificial layer 114a1, and channel layers 114b', in accordance with some embodiments. The thick sacrificial layer 114a1 is over the sacrificial layers 114a' and the channel layers 114b', in accordance with some embodiments.

The thick sacrificial layer 114a1 is thicker than the sacrificial layer 114a', in accordance with some embodiments. The thick sacrificial layer 114a1 is thicker than the channel layer 114b', in accordance with some embodiments. The thick sacrificial layer 114a1 and the sacrificial layer 114a' are used to reserve a space for a metal gate stack formed in the subsequent process, in accordance with some embodiments.

The sacrificial layers 114a' and the channel layers 114b' are alternately arranged as illustrated in FIG. 1A, in accordance with some embodiments. It should be noted that, for the sake of simplicity, FIG. 1A shows three layers of the sacrificial layers 114a' and three layers of the channel layers 114b' for illustration, but does not limit the invention thereto. In some embodiments, the number of the sacrificial layers 114a' or the channel layers 114b' is between 2 and 10.

The sacrificial layers 114a' and the thick sacrificial layer 114a1 are made of a same first material, such as a first semiconductor material, in accordance with some embodiments. The channel layers 114b' are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 114a' and the thick sacrificial layer 114a1 are made of SiGe, and the channel layers 114b' are made of Si. The atomic percentage of Ge in the sacrificial layers 114a' or the thick sacrificial layer 114a1 ranges from about 5% to 40%, in accordance with some embodiments.

In some other embodiments, the sacrificial layers 114a' and the thick sacrificial layer 114a1 are made of Si, and the channel layers 114b' are made of SiGe. In some embodiments, the sacrificial layers 114a' or the channel layers 114b' are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or a combination thereof.

The channel layers 114b' and the lower portion 112 are made of the same material such as Si, in accordance with some embodiments. The material of the sacrificial layers 114a' and the thick sacrificial layer 114a1 is different from the material of the lower portion 112, in accordance with some embodiments. In some other embodiments, the sacrificial layers 114a', the thick sacrificial layer 114a1, the channel layers 114b', and the lower portion 112 are made of different materials, in accordance with some embodiments.

The sacrificial layers 114a', the thick sacrificial layer 114a1, and the channel layers 114b' are formed using an epitaxial growth process such as a molecular beam epitaxy (MBE) process, a metal-organic chemical vapor deposition (MOCVD) process, and/or another suitable epitaxial growth process. The epitaxial growth process is performed under about 350° C. to about 950° C. temperature and about 5 Torr to about 25 Torr pressure for about 10 seconds to about 40 seconds, in accordance with some embodiments.

As shown in FIG. 1A, a mask layer 120 is formed over the multilayer structure 114, in accordance with some embodiments. The mask layer 120 is made of an oxide material such as silicon dioxide ($SiO_2$), a nitride material such as silicon nitride ($Si_3N_4$), or another suitable material, which is different from the materials of the substrate 110 (or the multilayer structure 114), in accordance with some embodiments.

The mask layer 120 is formed using a deposition process, in accordance with some embodiments. The deposition process includes a physical vapor deposition process, a chemical vapor deposition process, or another suitable deposition process, in accordance with some embodiments.

As shown in FIG. 1B, portions of the mask layer 120 are removed to form trenches 122 in the mask layer 120, in accordance with some embodiments. The trenches 122 pass through the mask layer 120, in accordance with some embodiments. The removal process includes a photolithography process and an etching process (e.g., a dry etching process), in accordance with some embodiments.

As shown in FIG. 1B, portions of the substrate 110 exposed by the trenches 122 are removed through the trenches 122, in accordance with some embodiments. The removal process forms trenches 111 in the substrate 110, in accordance with some embodiments.

After the removal process, the remaining portion of the substrate 110 includes a base 113 and a fin structure 116, in accordance with some embodiments. The fin structure 116 is over the base 113, in accordance with some embodiments. The base 113 is formed from the lower portion 112 (as shown in FIG. 1A), in accordance with some embodiments.

The fin structure 116 includes a lower portion 115 and a portion of the multilayer structure 114, in accordance with some embodiments. The portion of the multilayer structure 114 includes portions of the sacrificial layers 114a', the thick sacrificial layer 114a1, and the channel layers 114b', in accordance with some embodiments. The lower portion 115 is formed from the lower portion 112 (as shown in FIG. 1A), in accordance with some embodiments.

As shown in FIG. 1C, the mask layer 120 is removed, in accordance with some embodiments. As shown in FIG. 1C, a liner layer 132 is conformally formed over sidewalls 116s of the fin structure 116 and a top surface 113a of the base 113, in accordance with some embodiments.

As shown in FIG. 1C, a dielectric layer 134 is formed over the liner layer 132 and in the trenches 111, in accordance with some embodiments. The liner layer 132 and the dielectric layer 134 together form an isolation structure 130, in accordance with some embodiments. The isolation structure 130 surrounds the fin structure 116, in accordance with some embodiments.

The liner layer 132 is made of oxides (e.g., silicon oxide), nitrides (e.g., silicon nitride), or another suitable dielectric material, in accordance with some embodiments. The dielectric layer 134 is made of oxide (such as silicon oxide), fluorosilicate glass (FSG), a low-k dielectric material, and/or another suitable dielectric material. In some embodiments, the liner layer 132 and the dielectric layer 134 are made of different materials.

The removal of the mask layer 120 and the formation of the liner layer 132 and the dielectric layer 134 include: conformally depositing a liner material layer (not shown) over the substrate 110; depositing a dielectric material layer (not shown) over the liner material layer; and performing a planarization process to remove the liner material layer and the dielectric material layer outside of the trenches 111 and the mask layer 120, in accordance with some embodiments.

The liner material layer may be deposited by an atomic layer deposition (ALD) process, a chemical vapor deposition (CVD) process, or another applicable process. The dielectric material layer may be deposited by a chemical vapor deposition process, an atomic layer deposition process, a physical vapor deposition (PVD) process, or another applicable process.

For the sake of simplicity, FIG. 1D omits depicting the boundary between the liner layer 132 and the dielectric layer 134 and only shows the isolation structure 130, in accordance with some embodiments. As shown in FIG. 1D, an upper portion of the isolation structure 130 is removed to expose sidewalls 114c of the multilayer structure 114, in accordance with some embodiments. The removal process includes an etching process such as a dry etching process or a wet etching process, in accordance with some embodiments.

As shown in FIG. 1D, a cladding layer 140 is formed over the sidewalls 114c of the multilayer structure 114, in accordance with some embodiments. The cladding layer 140 is used to reserve a space for a metal gate stack formed in the subsequent process, in accordance with some embodiments.

The sacrificial layers 114a', the thick sacrificial layer 114a1, and the cladding layer 140 are made of the same first material, in accordance with some embodiments. The channel layers 114b' are made of a second material, in accordance with some embodiments. The first material is different from the second material, in accordance with some embodiments.

The cladding layer 140 is made of a semiconductor material such as SiGe, Si, and/or germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or a combination thereof, in accordance with some embodiments.

The cladding layer 140 is formed using an epitaxial growth process such as a molecular beam epitaxy (MBE) process, a metal-organic chemical vapor deposition (MOCVD) process, and/or another suitable epitaxial growth process.

As shown in FIG. 1E, a liner layer 152 is conformally formed over the isolation structure 130, the cladding layer 140, and the multilayer structure 114, in accordance with some embodiments. As shown in FIG. 1E, a dielectric layer 154 is formed over the liner layer 152 and in the trenches 111, in accordance with some embodiments. The liner layer 152 and the dielectric layer 154 together form an isolation structure 150, in accordance with some embodiments.

The liner layer 152 is made of oxides (e.g., silicon oxide), nitrides (e.g., silicon nitride), or another suitable dielectric material, in accordance with some embodiments. The dielectric layer 154 is made of oxide (such as silicon oxide), fluorosilicate glass (FSG), a low-k dielectric material, and/or another suitable dielectric material. In some embodiments, the liner layer 152 and the dielectric layer 154 are made of different materials.

The liner layer 152 may be deposited by an atomic layer deposition (ALD) process, a chemical vapor deposition (CVD) process, or another applicable process. The dielectric layer 154 may be deposited by a chemical vapor deposition process, an atomic layer deposition process, a physical vapor deposition (PVD) process, or another applicable process.

As shown in FIG. 1F, an upper portion of the isolation structure 150 is removed, in accordance with some embodiments. The removal process includes an etching process such as a dry etching process or a wet etching process, in accordance with some embodiments.

As shown in FIG. 1G, dielectric fins 160 are formed over the isolation structure 150 and in the trenches 111, in accordance with some embodiments. The formation of the dielectric fins 160 includes forming a dielectric layer (not shown) over the isolation structure 150, the cladding layer 140, and the multilayer structure 114 and in the trenches 111;

and removing portions of the dielectric layer outside of the trenches 111, in accordance with some embodiments. The dielectric layer remaining in the trenches 111 forms the dielectric fins 160, in accordance with some embodiments.

The dielectric layer is formed using a deposition process such as a physical vapor deposition process, a chemical vapor deposition process, an atomic layer deposition process, or the like, in accordance with some embodiments. The removal process of the portions of the dielectric layer outside of the trenches 111 includes a planarization process such as a chemical mechanical polishing process, in accordance with some embodiments.

The dielectric fins 160 are made of a dielectric material, such as a high dielectric constant (high-k) material, in accordance with some embodiments. The term "high-k material" means a material having a dielectric constant greater than the dielectric constant of silicon dioxide, in accordance with some embodiments.

The high-k material includes metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or a combination thereof, in accordance with some embodiments.

In some other embodiments, the high-k material includes metal nitrides, metal silicates, transition metal-oxides, transition metal-nitrides, transition metal-silicates, oxynitrides of metals, other suitable materials, or combinations thereof.

As shown in FIG. 1H, the thick sacrificial layer 114a1 and upper portions of the cladding layer 140 are removed, in accordance with some embodiments. After the removal process, a trench 162 is formed between the dielectric fins 160, in accordance with some embodiments.

The trench 162 exposes the multilayer structure 114 and the cladding layer 140 thereunder, in accordance with some embodiments. The removal process includes an etching process such as a wet etching process or a dry etching process, in accordance with some embodiments.

As shown in FIG. 1I, gate stacks 170 are formed over the dielectric fins 160, the multilayer structure 114, and the cladding layer 140, in accordance with some embodiments. As shown in FIG. 1I, mask layers M1 and M2 are formed over the gate stacks 170, in accordance with some embodiments. The mask layer M1 is between the mask layer M2 and the gate stacks 170, in accordance with some embodiments.

Each gate stack 170 includes a gate dielectric layer 172 and a gate electrode 174, in accordance with some embodiments. The gate electrode 174 is over the gate dielectric layer 172, in accordance with some embodiments. The mask layer M1 has strip portions M1s, in accordance with some embodiments.

The mask layer M2 has strip portions M2s, in accordance with some embodiments. One of the strip portions M1s covers one of the gate stacks 170, in accordance with some embodiments. One of the strip portions M2s covers the corresponding one of the strip portions M1s, in accordance with some embodiments.

The formation of the gate stacks 170 includes conformally forming a gate dielectric material layer (not shown) over the dielectric fins 160, the multilayer structure 114, and the cladding layer 140; forming a gate electrode layer (not shown) over the gate dielectric material layer; forming a first mask material layer (not shown) over the gate electrode layer; forming a second mask material layer (not shown) over the first mask material layer; patterning the first mask material layer and the second mask material layer by a photolithography process and an etching process to form the mask layers M1 and M2, which expose portions of the gate electrode layer; and removing the portions of the gate electrode layer and the gate dielectric material layer exposed by the mask layers M1 and M2, in accordance with some embodiments.

After the removal process, the remaining gate electrode layer forms the gate electrode 174 of each gate stack 170, and the remaining gate dielectric material layer forms the gate dielectric layer 172 of each gate stack 170, in accordance with some embodiments.

The gate dielectric material layer or the gate dielectric layer 172 is made of an insulating material, such as oxide (e.g., silicon oxide), in accordance with some embodiments. The gate dielectric material layer is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a physical vapor deposition (PVD) process, or another applicable process.

The gate electrode layer or the gate electrode 174 is made of a semiconductor material (e.g. polysilicon) or a conductive material (e.g., metal or alloy), in accordance with some embodiments. The gate electrode layer is formed by a deposition process, such as a physical vapor deposition (PVD) process, a chemical vapor deposition (CVD) process, or another applicable process, in accordance with some embodiments.

In some embodiments, the mask layer M1 serves a buffer layer or an adhesion layer that is formed between the underlying gate electrode 174 and the overlying mask layer M2. The mask layer M1 may also be used as an etch stop layer when the mask layer M2 is removed or etched.

In some embodiments, the mask layer M1 is made of an oxide-containing insulating material (e.g., silicon oxide), a nitride-containing insulating material (e.g., silicon nitride, silicon carbide, silicon oxynitride, silicon oxycarbonitride, or silicon carbonitride), or a metal oxide material (e.g., aluminum oxide).

In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide). The mask layers M1 and M2 are made of different materials, in accordance with some embodiments.

In some embodiments, the first mask material layer is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

In some embodiments, the second mask material layer is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

In some embodiments, the removal process of the portions of the gate electrode layer and the gate dielectric material layer exposed by the mask layers M1 and M2 includes an etching process, such as an anisotropic etching process (e.g., a dry etching process), in accordance with some embodiments.

Figures 2, 2A:
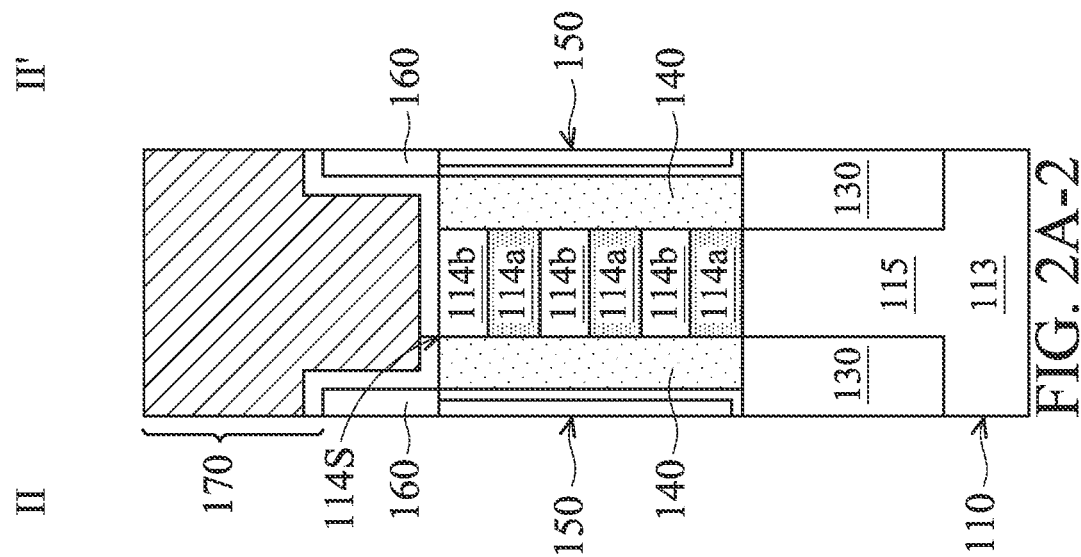
Figures 1, 2A:
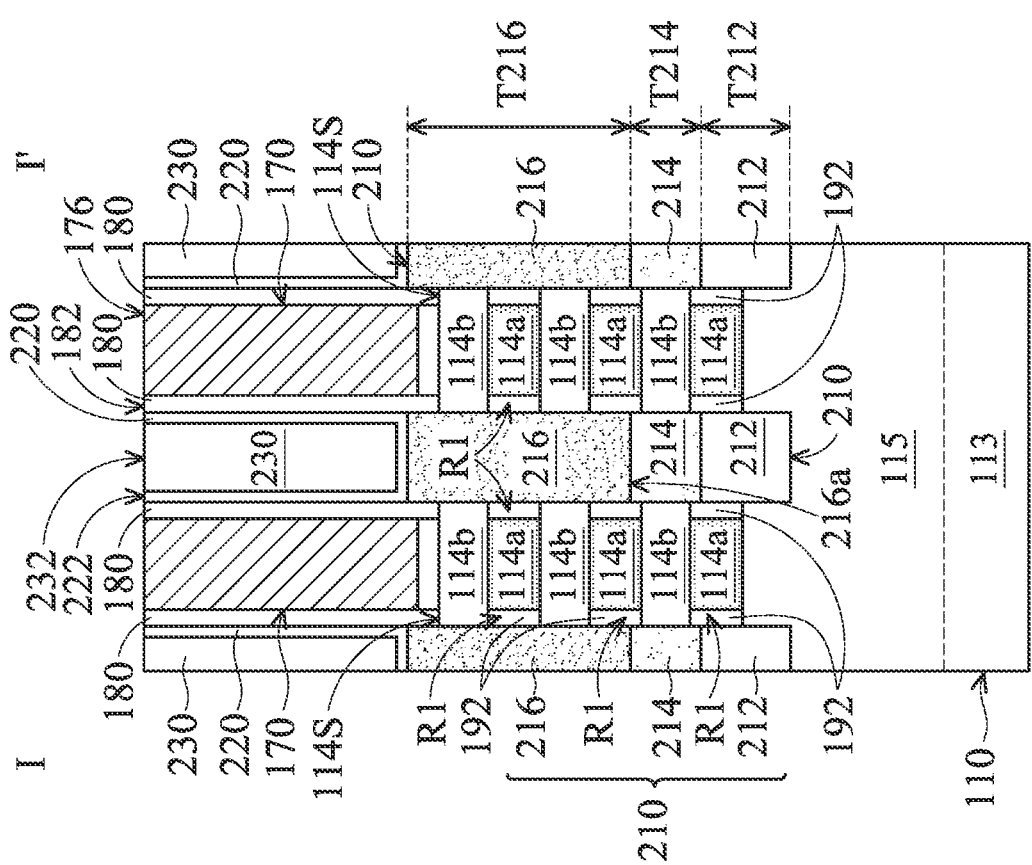

FIG. 1J-1 is a cross-sectional view illustrating the semiconductor device structure along a sectional line I-I' in FIG. 1J, in accordance with some embodiments. FIG. 1J-2 is a cross-sectional view illustrating the semiconductor device structure along a sectional line II-II' in FIG. 1J, in accordance with some embodiments.

As shown in FIGS. 1J, 1J-1, and 1J-2, a spacer 180 is formed over sidewalls of the gate stacks 170 and the mask layers M1 and M2, in accordance with some embodiments. In some embodiments, the spacer 180 is a single-layered structure. In some embodiments, the spacer 180 is a multi-layered structure.

The spacer 180 is made of an oxide-containing insulating material, such as silicon oxide. In some other embodiments, the spacer 180 is made of a nitride-containing insulating material, such as silicon nitride (SiN), silicon oxynitride (SiON), silicon oxycarbonitride (SiOCN), or silicon carbonitride (SiCN).

The formation of the spacer 180 includes forming a spacer layer (not shown) over the fin structure 116, the cladding layer 140, the dielectric fins 160, and the mask layers M1 and M2; and removing portions of the spacer layer, in accordance with some embodiments.

The spacer layer is formed using a deposition process, such as a chemical vapor deposition (CVD) process, an atomic layer deposition (ALD) process, or a physical vapor deposition (PVD) process, in accordance with some embodiments. The removal process includes an etching process, such as an anisotropic etching process (e.g., a dry etching process), in accordance with some embodiments.

As shown in FIGS. 1J, 1J-1, and 1J-2, the fin structure 116, the dielectric fins 160, and the cladding layer 140, which are not covered by the gate stacks 170 and the spacer 180, are partially removed, in accordance with some embodiments. After the removal process, a portion of the cladding layer 140 remains under the gate stacks 170 and the spacer 180, in accordance with some embodiments.

The removal process partially removes the multilayer structure 114 and the lower portion 115, which are not covered by the gate stacks 170 and the spacer 180, in accordance with some embodiments. The removal process further partially removes the isolation structure 130, which is not covered by the gate stacks 170 and the spacer 180, in accordance with some embodiments. Therefore, the removal process forms recesses R in the lower portion 115 of the fin structure 116 and the isolation structure 130, which are not covered by the gate stacks 170 and the spacer 180, in accordance with some embodiments.

The removal process forms recesses 116a in the fin structure 116, in accordance with some embodiments. The multilayer structure 114 is divided into multilayer stacks 114S by the recesses 116a, in accordance with some embodiments.

In each multilayer stack 114S, the remaining sacrificial layers 114a' form sacrificial nanostructures 114a, and the remaining channel layers 114b' form channel nanostructures 114b, in accordance with some embodiments. Each multilayer stack 114S includes three sacrificial nanostructures 114a and three channel nanostructures 114b, in accordance with some embodiments.

The sacrificial nanostructures 114a and the channel nanostructures 114b include nanowires and/or nanosheets, in accordance with some embodiments. The thickness T114a of the sacrificial nanostructure 114a ranges from about 1 nm to about 15 nm, in accordance with some embodiments. The thickness T114b of the channel nanostructure 114b ranges from about 1 nm to about 15 nm, in accordance with some embodiments.

In some embodiments, the thickness T114a is substantially equal to the thickness T114b. In some embodiments, the thickness T114a is less than the thickness T114b. In some embodiments, the thickness T114a is greater than the thickness T114b. The removal process for forming the recesses 116a includes an etching process, such as an anisotropic etching process (e.g., a dry etching process), in accordance with some embodiments.

As shown in FIG. 1J-1, the thickness T170 of the gate stack 170 ranges from about 80 nm to about 140 nm, in accordance with some embodiments. The thickness T170 ranges from about 100 nm to about 120 nm, in accordance with some embodiments. The thickness T114S of the multilayer stack 114S ranges from about 40 nm to about 110 nm, in accordance with some embodiments. The thickness T114S of the multilayer stack 114S ranges from about 60 nm to about 90 nm, in accordance with some embodiments.

As shown in FIGS. 1J and 1K, portions of the sacrificial nanostructures 114a and the cladding layer 140 are removed from sidewalls S1 of the sacrificial nanostructures 114a and sidewalls 142 of the cladding layer 140, in accordance with some embodiments.

Therefore, the removal process forms recesses R1 in the multilayer stacks 114S, in accordance with some embodiments. Each recess R1 is surrounded by the corresponding sacrificial nanostructure 114a and the corresponding channel nanostructures 114b, in accordance with some embodiments.

As shown in FIG. 1K, the removal process forms recesses R2, in accordance with some embodiments. Each recess R2 is surrounded by the cladding layer 140, the corresponding gate stack 170, the corresponding multilayer stack 114S, and the isolation structure 150, in accordance with some embodiments. The recesses R2 are on opposite sides of the multilayer stack 114S, in accordance with some embodiments.

The removal process includes etching processes, such as dry etching processes and wet etching processes, in accordance with some embodiments. In some embodiments, the removal process includes a first dry etching process, a first wet etching process, a second dry etching process, and a second wet etching process, which are performed sequentially.

The first dry etching process includes a plasma etching process, in accordance with some embodiments. The first dry etching process uses He gas of about 300 sccm to about 2200 sccm, Ar gas of about 80 sccm to about 1100 sccm, and NF3 gas of about 5 sccm to about 200 sccm under about 0° C. to about 30° C. temperature and about 0.5 Torr to about 15 Torr pressure for about 30 seconds to about 80 seconds, in accordance with some embodiments.

The first wet etching process uses a dilute hydrofluoric acid (HF) solution, in accordance with some embodiments. The volume percentage concentration of the dilute hydrofluoric acid solution ranges from about 0.5% to about 2%, in accordance with some embodiments.

The second dry etching process uses He gas of about 300 sccm to about 2200 sccm, Ar gas of about 80 sccm to about 1100 sccm, and NF3 gas of about 5 sccm to about 200 sccm under about 0° C. to about 30° C. temperature and about 0.5 Torr to about 15 Torr pressure for about 10 seconds to about 50 seconds, in accordance with some embodiments.

The second wet etching process uses a dilute hydrofluoric acid solution, in accordance with some embodiments. The volume percentage concentration of the dilute hydrofluoric acid solution ranges from about 0.5% to about 2%, in accordance with some embodiments.

As shown in FIG. 1L, an inner spacer structure 190 is formed in the recesses R1 and R2, in accordance with some embodiments. The inner spacer structure 190 is a continuous structure, in accordance with some embodiments. The inner spacer structure 190 is wrapped around the corresponding multilayer stack 114S, in accordance with some embodiments.

The inner spacer structure 190 includes inner spacers 192 and 194, in accordance with some embodiments. The inner spacers 192 are in the recesses R1 of the multilayer stacks 114S, in accordance with some embodiments. The inner spacers 194 are in the recesses R2, which are surrounded by the cladding layer 140, the corresponding gate stack 170, the corresponding multilayer stack 114S, and the isolation structure 150, in accordance with some embodiments.

In some embodiments, the inner spacer structure 190 is made of an oxide-containing insulating material, such as silicon oxide, or a nitride-containing insulating material, such as silicon nitride (SiN), silicon oxynitride (SiON), silicon oxycarbonitride (SiOCN), or silicon carbonitride (SiCN), in accordance with some embodiments.

The formation of the inner spacer structure 190 includes forming an inner spacer material layer over the spacer 180, the mask layer M2, the dielectric fins 160, the isolation structure 130, and the substrate 110 and in the recesses R1 and R2; and removing portions of the inner spacer material layer outside of the recesses R1 and R2, in accordance with some embodiments. The remaining inner spacer material layer forms the inner spacer structure 190, in accordance with some embodiments.

The inner spacer material layer is formed using a deposition process such as an atomic layer deposition (ALD) process, a chemical vapor deposition (CVD) process, or another applicable process. The removal process of the portions of the inner spacer material layer outside of the recesses R1 and R2 includes an etching process, such as a dry etching process or a wet etching process, in accordance with some embodiments.

As shown in FIG. 1M, an undoped semiconductor layer 212 is formed in the recesses R, in accordance with some embodiments. The undoped semiconductor layer 212 is used to provide a top surface 212a without residues coming from the removal process of FIG. 1J, in accordance with some embodiments. The (clean) top surface 212a is conducive to form epitaxial structures thereon, in accordance with some embodiments.

The recesses R are filled up with the undoped semiconductor layer 212, in accordance with some embodiments. The undoped semiconductor layer 212 is partially embedded in the isolation structure 130 and the lower portion 115 of the fin structure 116, in accordance with some embodiments.

In some embodiments, the entire top surface 212a of the undoped semiconductor layer 212 is over a top surface 136 of the isolation structure 130. The undoped semiconductor layer 212 has a thickness T212 ranges from about 10 nm to about 30 nm, in accordance with some embodiments. The thickness T212 ranges from about 20 nm to about 30 nm, in accordance with some embodiments.

As shown in FIG. 1M, the nanostructures 114b include nanostructures 114b1, 114b2, and 114b3, in accordance with some embodiments. The undoped semiconductor layer 212 has a trapezoidal shape, in accordance with some embodiments. The top surface 212a of the undoped semiconductor layer 212 is a curved surface, such as a convex curved surface, in accordance with some embodiments. The top surface 212a of the undoped semiconductor layer 212 is a (100) surface, in accordance with some embodiments.

The undoped semiconductor layer 212 is made of an elementary semiconductor material including silicon or another suitable material in a single crystal, polycrystal, or amorphous structure, in accordance with some embodiments.

The undoped semiconductor layer 212 is formed using an epitaxial process and an etching process, in accordance with some embodiments. Specifically, the epitaxial process and the etching process are performed simultaneously, in accordance with some embodiments.

The etching process is performed to remove the epitaxial structure formed over the sidewalls of the nanostructures 114b1, 114b2, and 114b3, in accordance with some embodiments. The etching process is performed using an etching gas including an HCl gas, in accordance with some embodiments. In the etching process, the flow rate of the HCl gas ranges from about 80 sccm to 130 sccm, in accordance with some embodiments.

The sidewalls of the nanostructures 114b1, 114b2, and 114b3 are (110) surfaces, in accordance with some embodiments. The upper surface 115a of the lower portion 115 of the fin structure 116 is a (100) surface, in accordance with some embodiments. The undoped semiconductor layer 212 grows from the upper surface 115a of the lower portion 115 and therefore has the top surface 212a, which is a (100) surface, in accordance with some embodiments.

The epitaxial process is performed at high temperature and at low pressure to improve the growth rate of the undoped semiconductor layer 212 with the (100) surface so as to fill the recesses R up with the undoped semiconductor layer 212, in accordance with some embodiments. The process temperature of the epitaxial process ranges from about 700° C. to about 900° C., in accordance with some embodiments. The process temperature of the epitaxial process ranges from about 700° C. to about 800° C., in accordance with some embodiments.

The process pressure of the epitaxial process ranges from about 5 torr to about 30 torr, in accordance with some embodiments. The process pressure of the epitaxial process ranges from about 5 torr to about 25 torr, in accordance with some embodiments. The process pressure of the epitaxial process ranges from about 5 torr to about 20 torr, in accordance with some embodiments.

If the undoped semiconductor layer 212 is in direct contact with the inner spacer structure 190, the growth rate of the undoped semiconductor layer 212 with the (100) surface is decreased, in accordance with some embodiments. Therefore, the top surface 212a of the undoped semiconductor layer 212 is lower than a bottom surface of the nanostructure 114b1, in accordance with some embodiments.

As shown in FIG. 1M, a doped layer 214 is formed over the undoped semiconductor layer 212, in accordance with some embodiments. The undoped semiconductor layer 212 separates the doped layer 214 from the lower portion 115 of the fin structure 116 and the isolation structure 130, which prevents the dopants in the doped layer 214 from diffusing into the isolation structure 130, in accordance with some embodiments.

Therefore, the generation of the leakage current between source/drain structures formed subsequently is prevented, and the short circuit between the source/drain structures is prevented, in accordance with some embodiments. Therefore, the drain-induced barrier lowering (DIBL) issue is prevented, in accordance with some embodiments.

In some embodiments, a top surface 214a of the doped layer 214 is between a top surface of the nanostructure 114b1 and a bottom surface of the nanostructure 114b2. The doped layer 214 is in direct contact with the nanostructure 114b1, in accordance with some embodiments. The top surface 214a of the doped layer 214 is a curved surface, such as a convex curved surface, in accordance with some embodiments.

The thickness T214 of the doped layer 214 ranges from about 2 nm to about 20 nm, in accordance with some embodiments. The thickness T214 of the doped layer 214 ranges from about 5 nm to about 15 nm, in accordance with some embodiments. The doped layer 214 is thinner than the undoped semiconductor layer 212, in accordance with some embodiments.

In some embodiments, the doped layer 214 is made of a semiconductor material (e.g., silicon germanium) with P-type dopants, such as the Group IIIA element, in accordance with some embodiments. The Group IIIA element includes boron or another suitable material.

In some other embodiments, the doped layer 214 is made of a semiconductor material (e.g., silicon) with N-type dopants, such as the Group VA element, in accordance with some embodiments. The Group VA element includes phosphor (P), antimony (Sb), or another suitable Group VA material.

The dopant concentration of the doped layer 214 ranges from about $1*10^{20}$ atom/cm$^3$ to about $5*10^{20}$ atom/cm$^3$, in accordance with some embodiments. The doped layer 214 is formed using an epitaxial process, in accordance with some embodiments.

As shown in FIG. 1M, a doped layer 216 is formed over the doped layer 214, in accordance with some embodiments. The top surface 216a of the doped layer 216 is a curved surface, such as a convex curved surface, in accordance with some embodiments. In one of the recesses 116a of the fin structure 116, the undoped semiconductor layer 212, the doped layer 214, and the doped layer 216 together form a source/drain structure 210, in accordance with some embodiments.

The undoped semiconductor layer 212 separates the doped layer 216 from the isolation structure 130 and the lower portion 115 of the fin structure 116, which prevents the dopants in the doped layer 216 from diffusing into the isolation structure 130, in accordance with some embodiments.

As a result, the generation of the leakage current between the source/drain structures 210 is prevented, and the short circuit between the source/drain structures 210 is prevented, in accordance with some embodiments. Therefore, the drain-induced barrier lowering (DIBL) issue is prevented, in accordance with some embodiments. The yield of the doped layer 216 is improved, in accordance with some embodiments.

The thickness T216 of the doped layer 216 ranges from about 40 nm to about 80 nm, in accordance with some embodiments. The thickness T216 of the doped layer 216 ranges from about 50 nm to about 70 nm, in accordance with some embodiments. The undoped semiconductor layer 212 is thinner than the doped layer 216, in accordance with some embodiments.

The dopant concentration of the doped layer 216 is greater than the dopant concentration of the doped layer 214, in accordance with some embodiments. In some embodiments, a conductivity of the doped layer 216 is greater than a conductivity of the doped layer 214. Therefore, the doped layer 216 can well control the channel nanostructures 114b, in accordance with some embodiments. The conductivity of the doped layer 214 is greater than a conductivity of the undoped semiconductor layer 212, in accordance with some embodiments.

In some embodiments, the doped layer 216 is made of a semiconductor material (e.g., silicon germanium) with P-type dopants, such as the Group IIIA element, in accordance with some embodiments. The Group IIIA element includes boron or another suitable material.

In some other embodiments, the doped layer 216 is made of a semiconductor material (e.g., silicon) with N-type dopants, such as the Group VA element, in accordance with some embodiments. The Group VA element includes phosphor (P), antimony (Sb), or another suitable Group VA material.

If the doped layer 216 is made of SiGe:B, the Ge concentration of the doped layer 216 ranges from about 40 atom % to about 60 atom %, in accordance with some embodiments. The B concentration of the doped layer 216 ranges from about $9*10^{20}$ atom/cm$^3$ to about $21*10^{21}$ atom/cm$^3$, in accordance with some embodiments. The doped layer 216 is formed using an epitaxial process, in accordance with some embodiments.

As shown in FIGS. 1M and 1N, the undoped semiconductor layer 212 and the doped layers 214 and 216 have a substantially same width, in accordance with some embodiments. The source/drain structures 210 are formed over the lower portion 115 of the fin structure 116, in accordance with some embodiments. The source/drain structures 210 are connected to the sidewalls of the channel nanostructures 114b, in accordance with some embodiments. The source/drain structures 210 are also referred to as stressors, in accordance with some embodiments.

FIG. 2A-1 is a cross-sectional view illustrating the semiconductor device structure along a sectional line I-I' in FIG. 1N, in accordance with some embodiments. FIG. 2A-2 is a cross-sectional view illustrating the semiconductor device structure along a sectional line II-II' in FIG. 1N, in accordance with some embodiments.

As shown in FIGS. 1N and 2A-1, an etch stop layer 220 is formed over the source/drain structures 210, the dielectric fins 160, and sidewalls of the spacer 180, in accordance with some embodiments. The etch stop layer 220 conformally covers the source/drain structures 210, the dielectric fins 160, and the sidewalls of the spacer 180, in accordance with some embodiments.

The etch stop layer 220 is made of a dielectric material such as a nitride-containing material including silicon nitride (SiN), silicon oxynitride (SiON), or silicon carbonitride (SiCN), in accordance with some embodiments.

As shown in FIGS. 1N and 2A-1, a dielectric layer 230 is formed over the etch stop layer 220, in accordance with some embodiments. The etch stop layer 220 is between the dielectric layer 230 and the source/drain structures 210 to separate the dielectric layer 230 from the source/drain structures 210, in accordance with some embodiments.

The dielectric layer 230 is made of an insulating material such as an oxide-containing material including silicon oxide, or a nitride-containing material including silicon nitride, silicon oxynitride, silicon oxycarbonitride, or silicon carbonitride, in accordance with some embodiments.

As shown in FIGS. 1N, 2A-1, and 2A-2, the mask layers M1 and M2 are removed, in accordance with some embodiments. As shown in FIG. 2A-1, after the removal process, top surfaces 222, 232, 182, and 176 of the etch stop layer 220, the dielectric layer 230, the spacer 180, and the gate stack 170 are substantially level with each other, in accordance with some embodiments. The removal process includes a planarization process such as a chemical mechanical polishing process, in accordance with some embodiments.

The formation of the etch stop layer 220 and the dielectric layer 230 and the removal process of the mask layers M1 and M2 include forming an etch stop material layer (not shown) over the source/drain structures 210, the spacer 180, and the mask layer M2; forming a dielectric material layer over the etch stop material layer; and removing top portions of the etch stop material layer, the dielectric material layer, the spacer 180, and the gate stack 170 and the mask layers M1 and M2, in accordance with some embodiments.

After the removal process, the remaining etch stop material layer forms the etch stop layer 220, and the remaining dielectric material layer forms the dielectric layer 230, in accordance with some embodiments. The etch stop material layer is formed using a deposition process, such as a chemical vapor deposition process or a physical vapor deposition process, in accordance with some embodiments. The dielectric material layer is formed using a deposition process, such as a chemical vapor deposition process or a physical vapor deposition process, in accordance with some embodiments.

Figures 2, 2C:
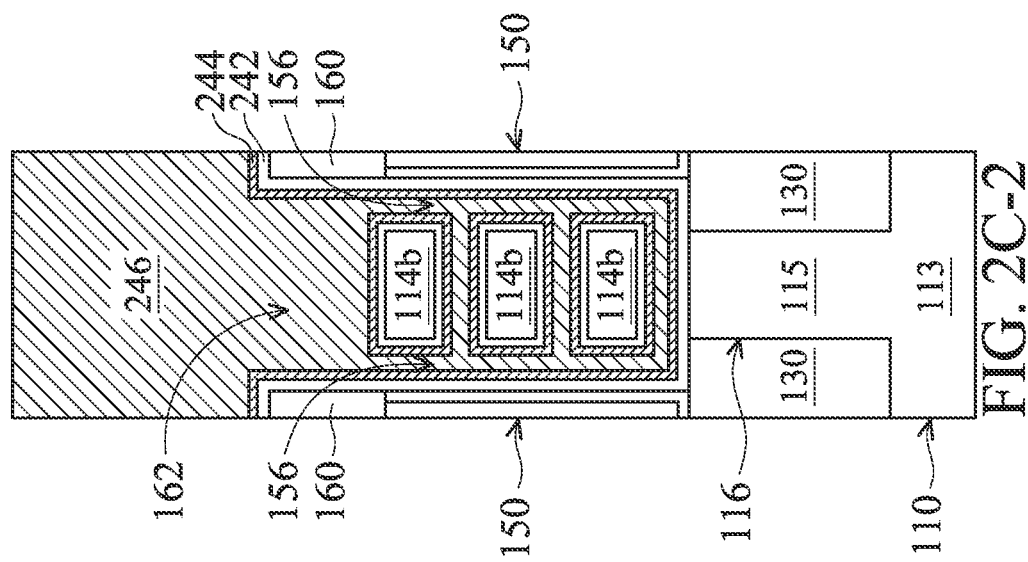
Figures 1, 2C:
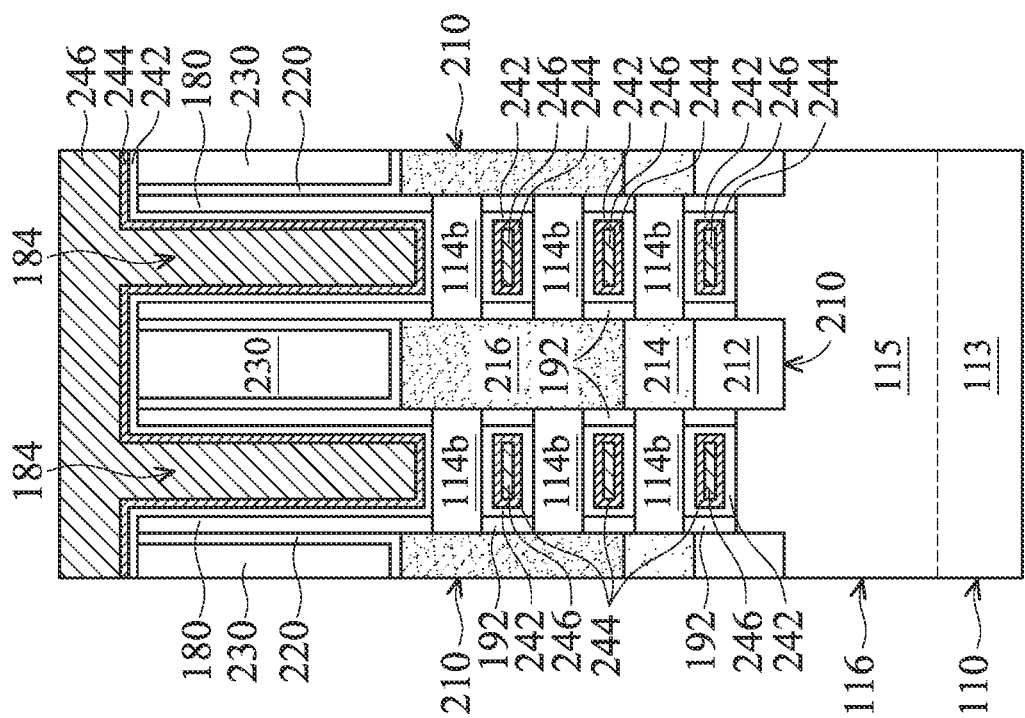
Figures 2, 2F:
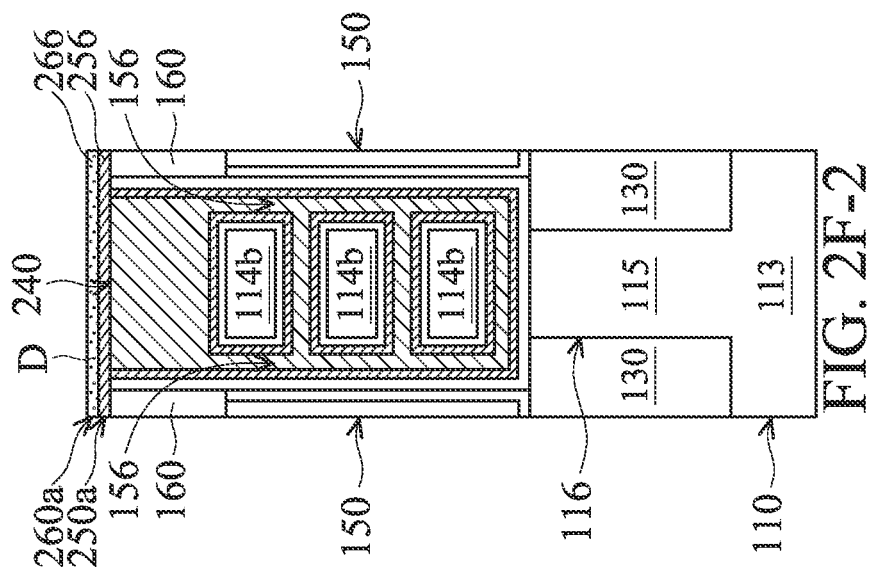
Figures 1, 2F:
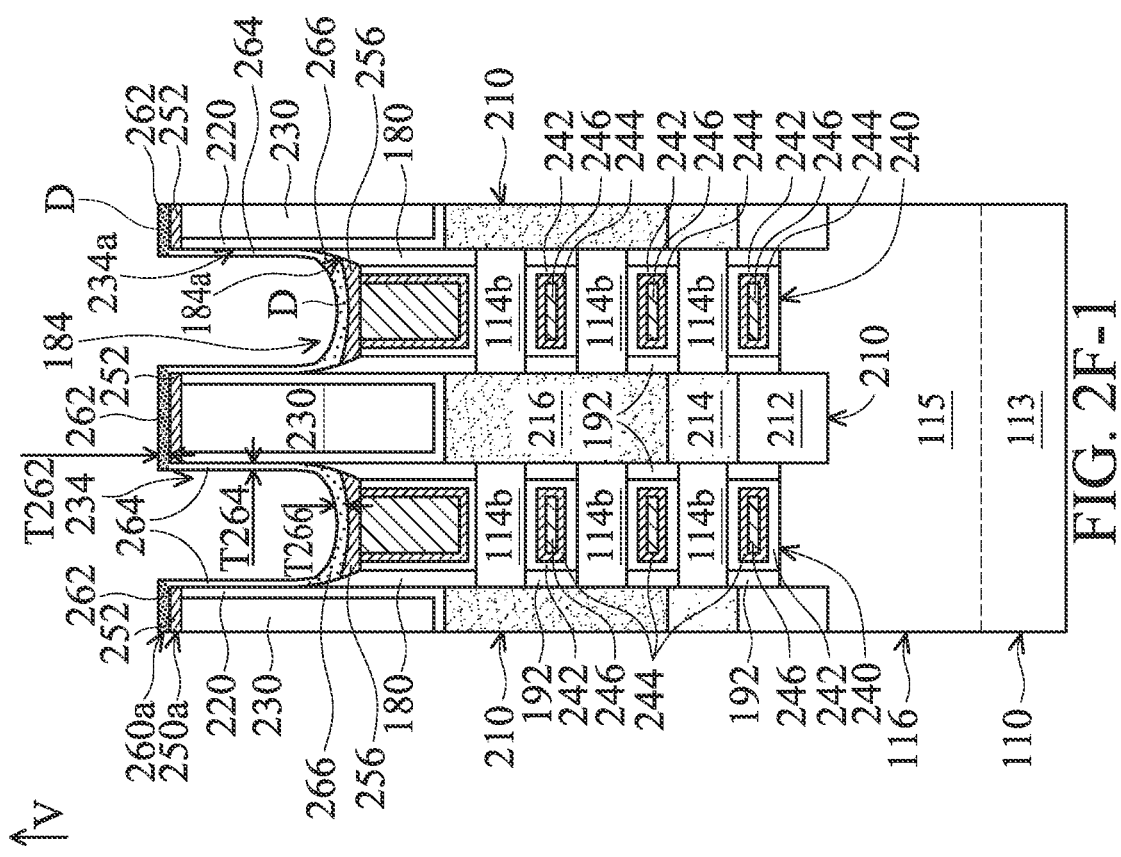
Figures 2, 2G:
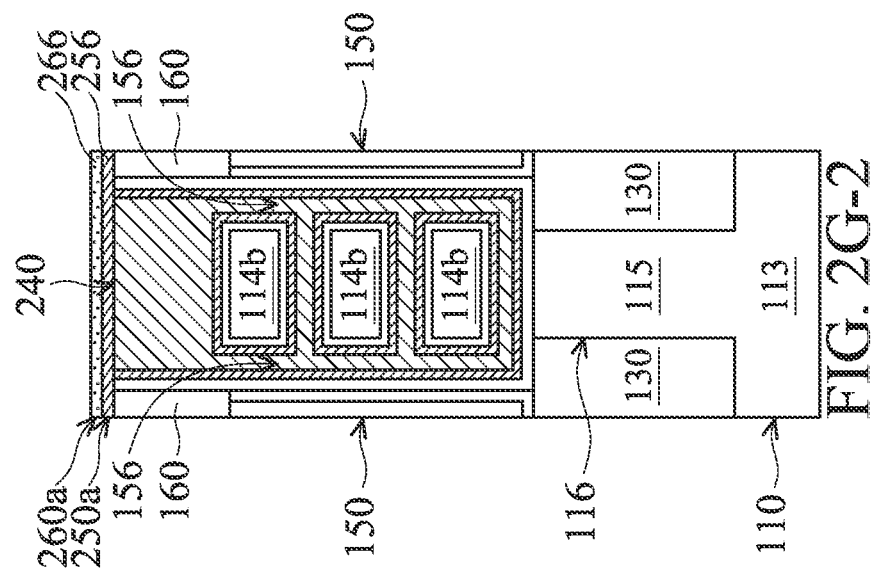
Figures 1, 2G:
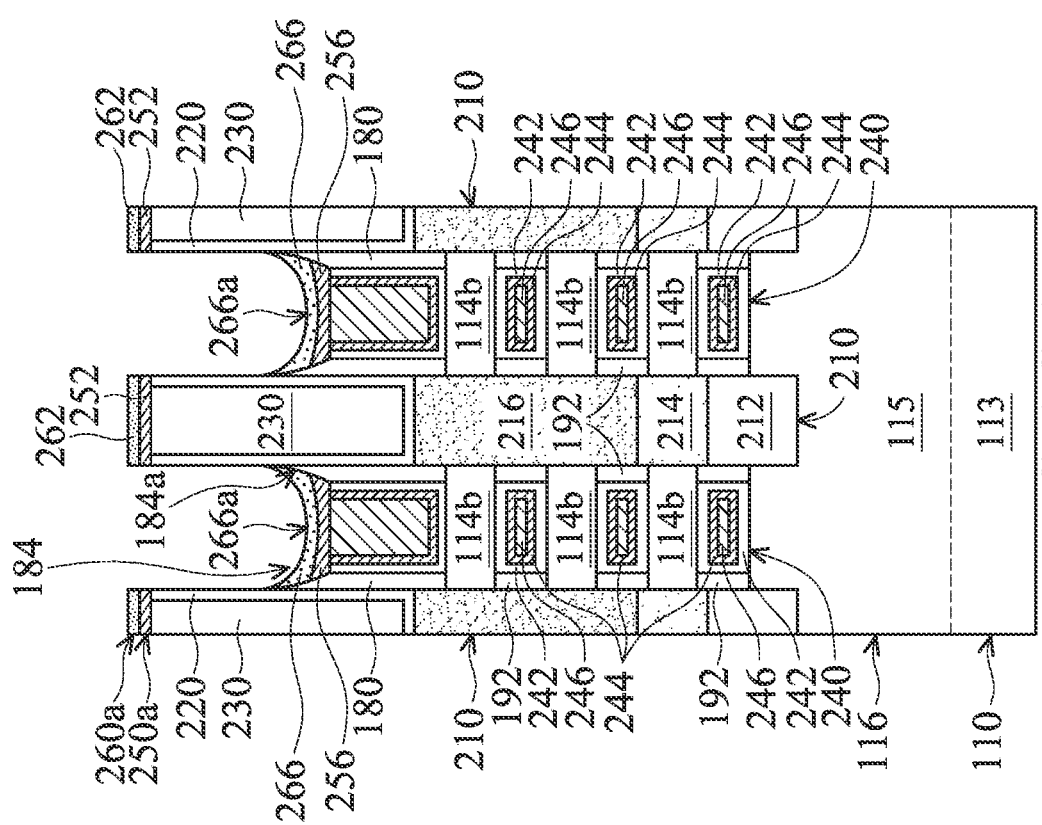
Figures 2, 2H:
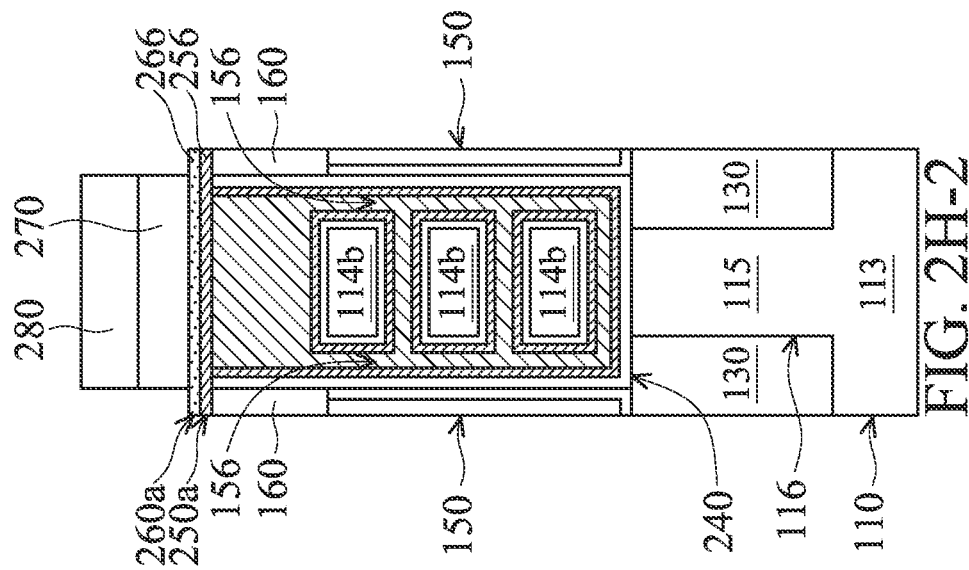
Figures 1, 2H:
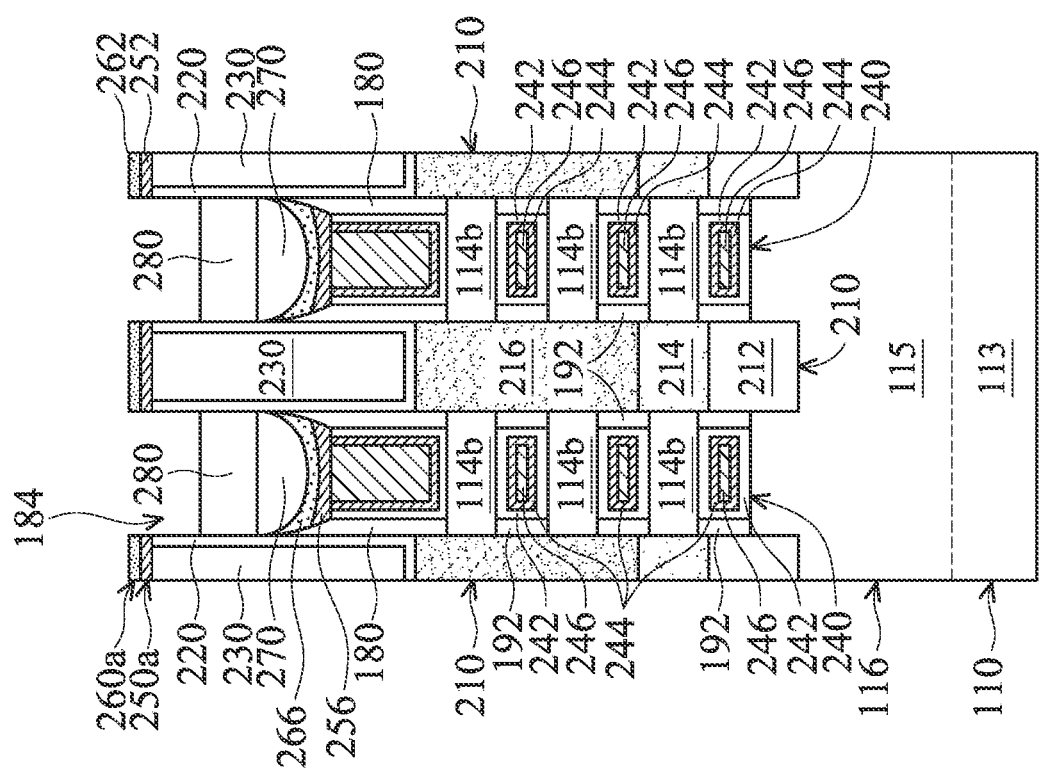
Figures 2, 2J:
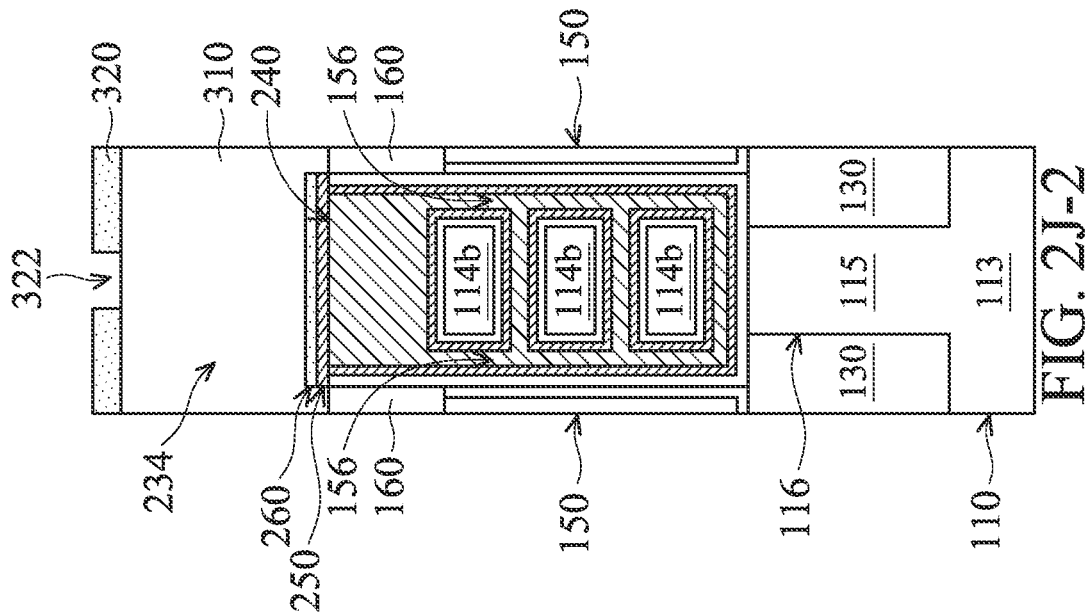
Figures 1, 2J:
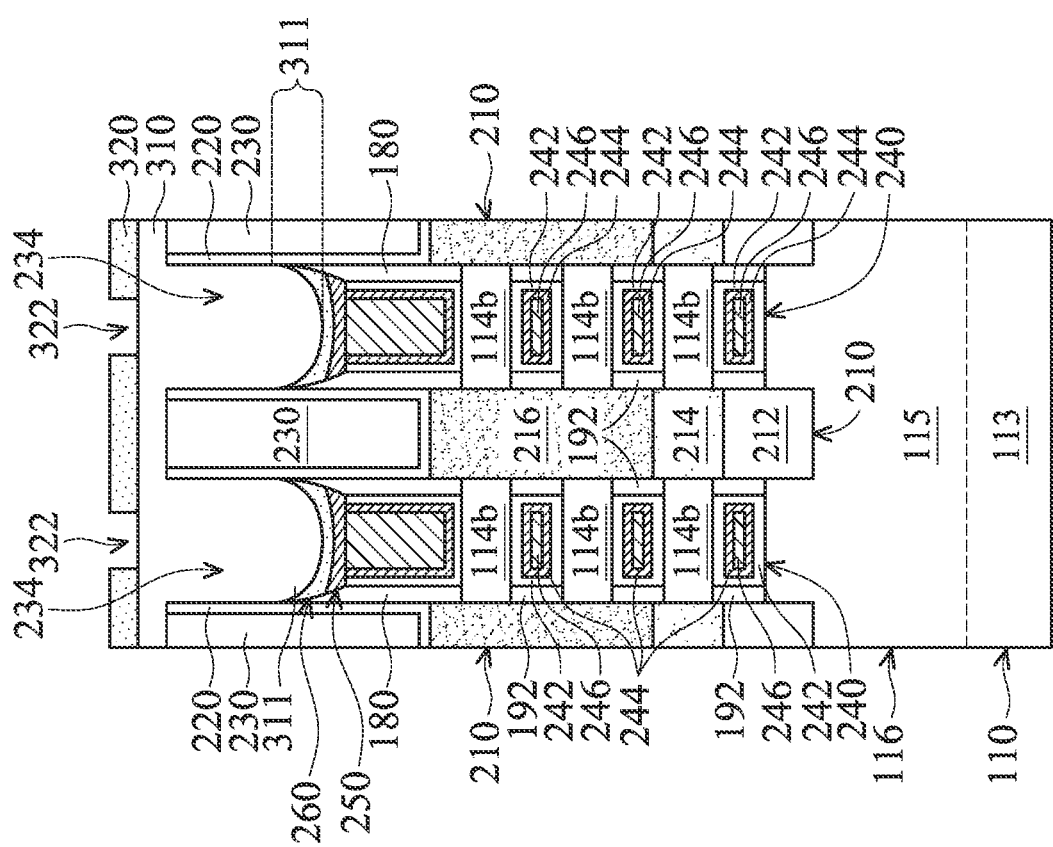
Figures 2, 2K:
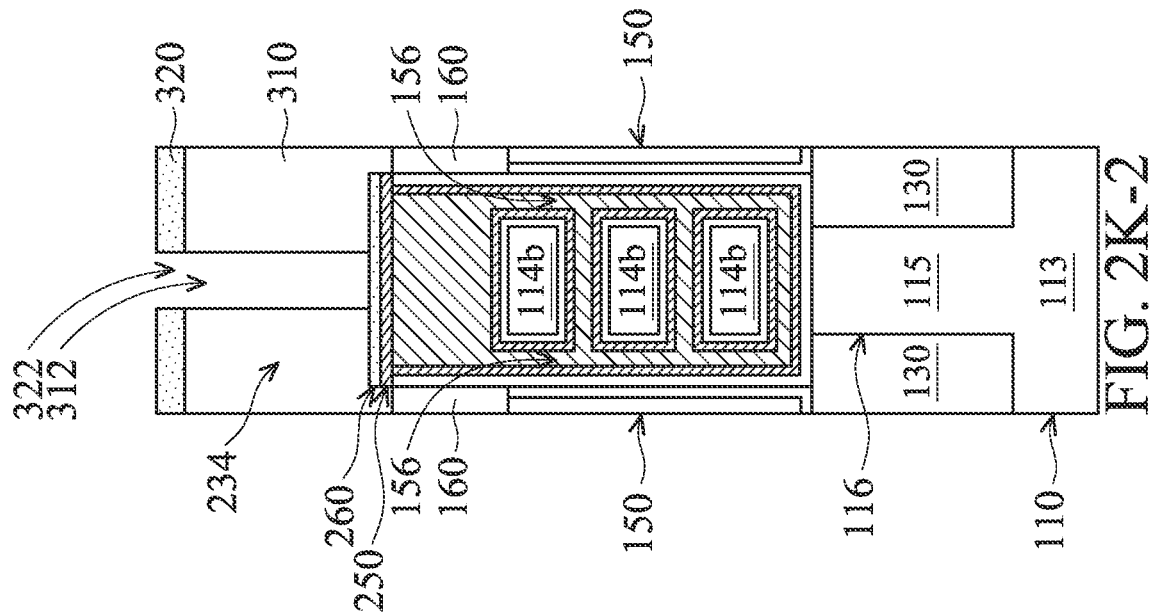
Figures 1, 2K:
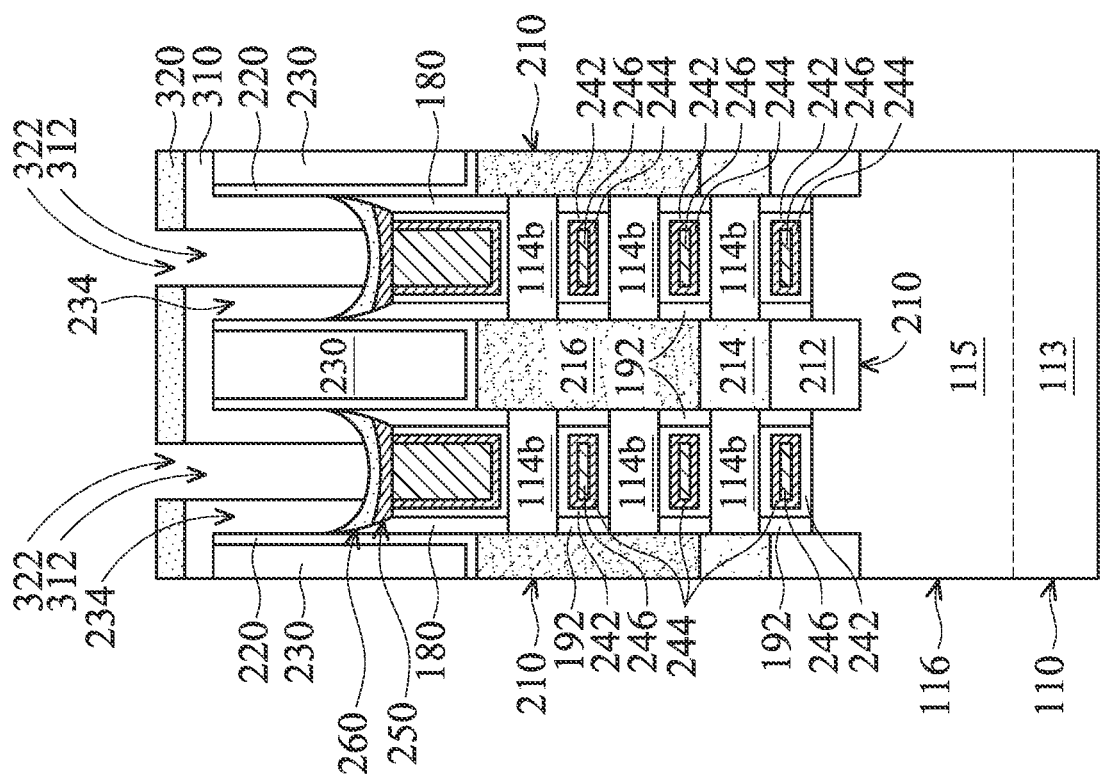
Figures 2, 2M:
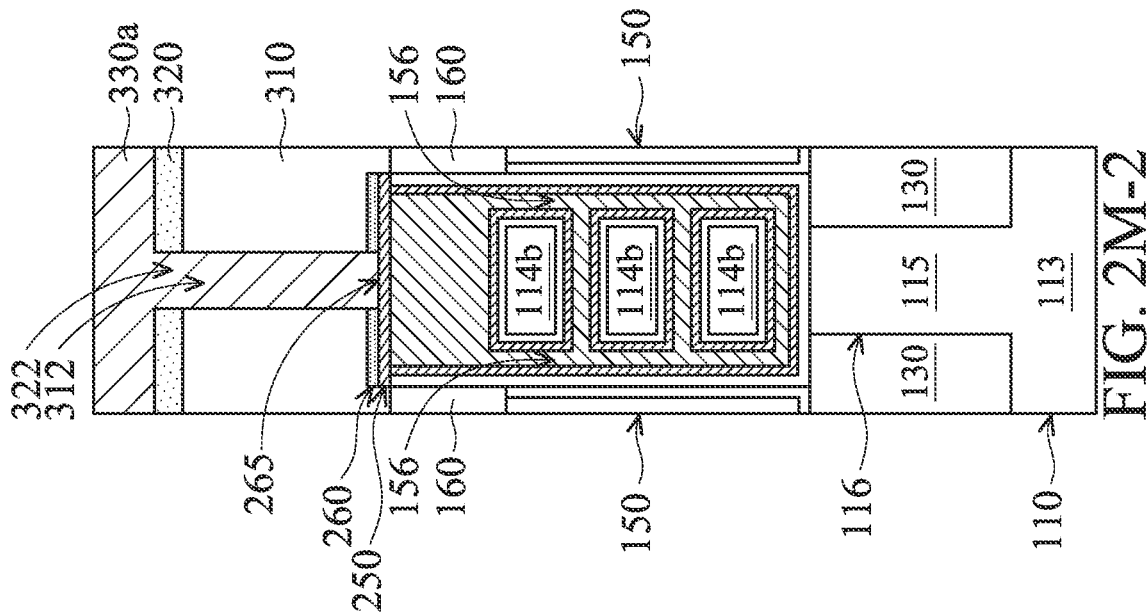
Figures 1, 2M:
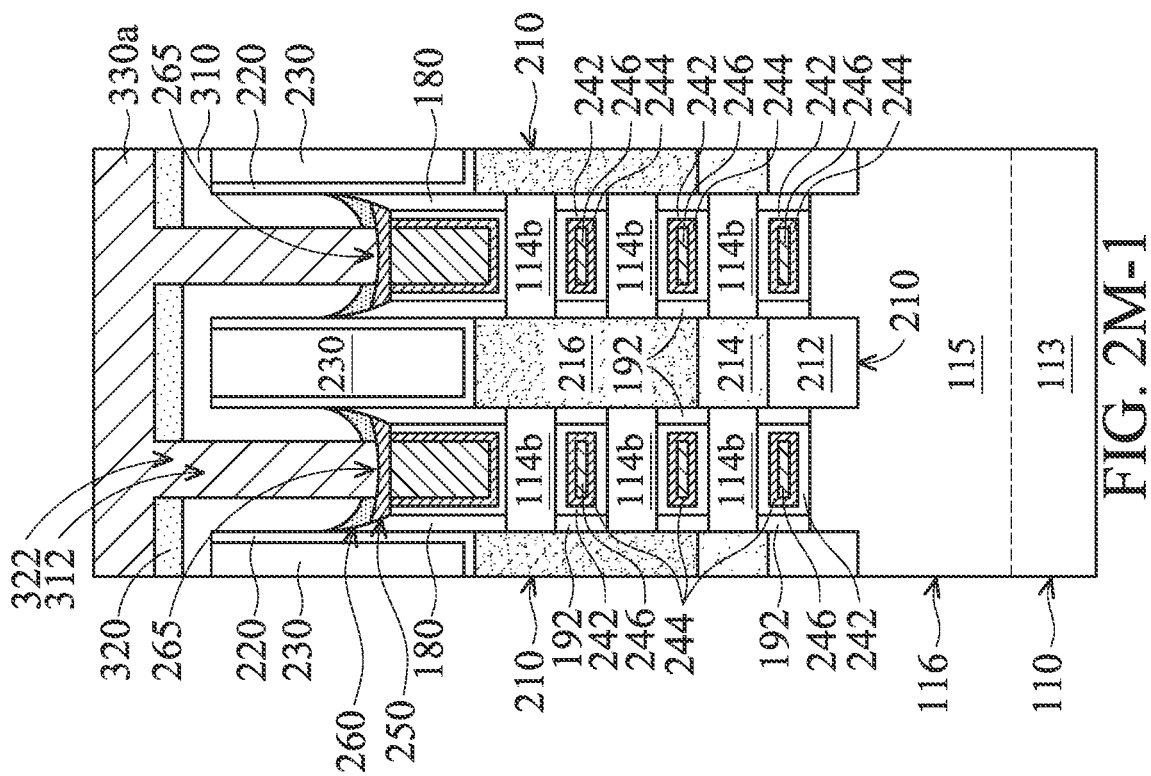
Figures 2, 2N:
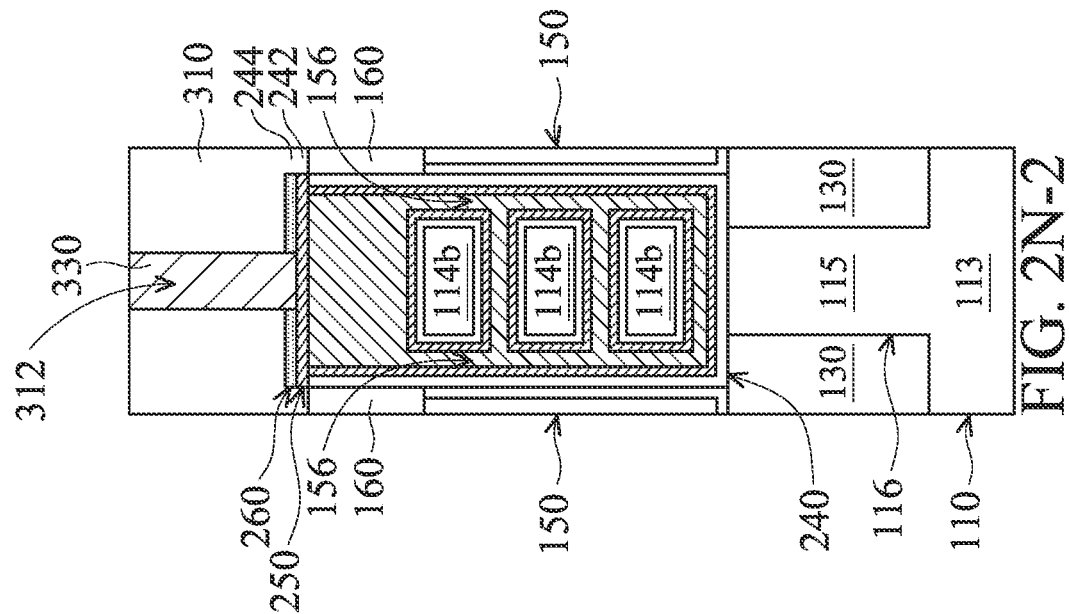
Figures 1, 2N:
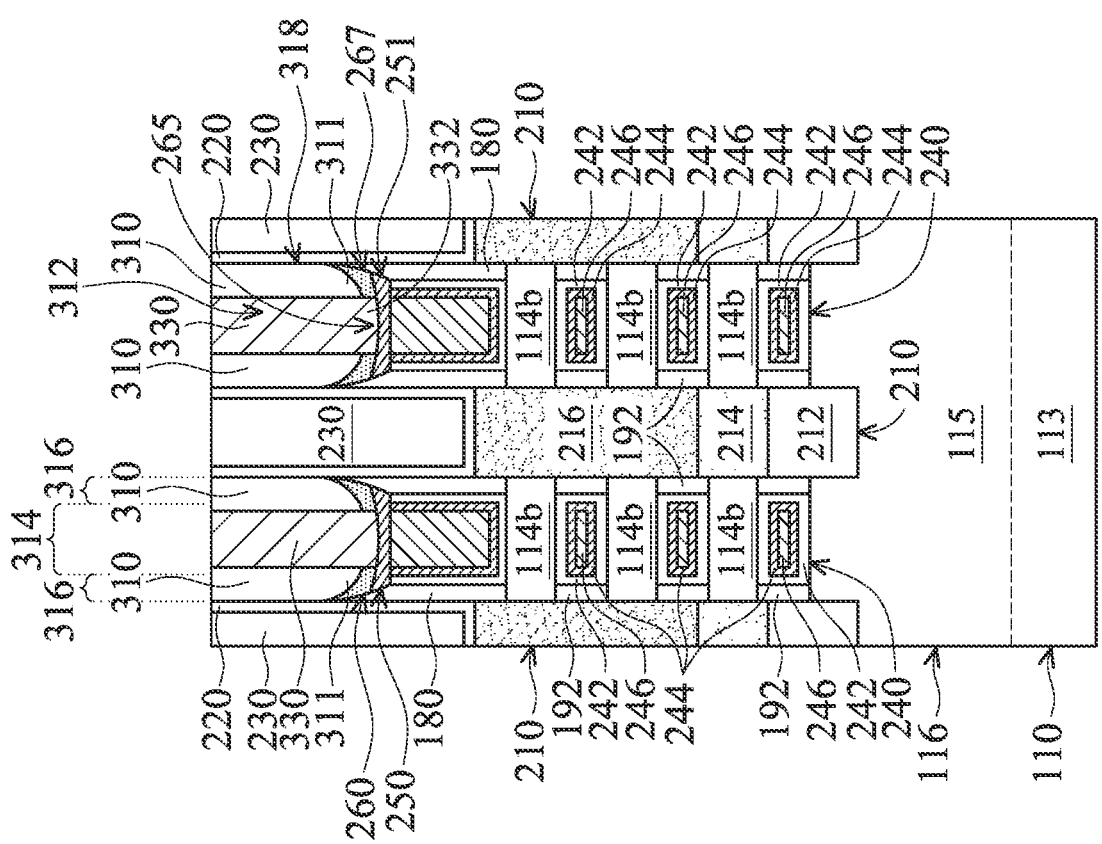

FIGS. 2A-1 to 2N-1 are cross-sectional views of various stages of a process for forming a semiconductor device structure, in accordance with some embodiments. FIGS. 2A-2 to 2N-2 are cross-sectional views of various stages of a process for forming a semiconductor device structure, in accordance with some embodiments.

As shown in FIGS. 2B-1 and 2B-2, the gate stacks 170 are removed to form trenches 184 in the spacer 180 and trenches 162 between the dielectric fins 160, in accordance with some embodiments. The removal process includes an etching process, such as a wet etching process or a dry etching process, in accordance with some embodiments.

As shown in FIGS. 2B-1 and 2B-2, the sacrificial nanostructures 114a and the cladding layer 140 are removed through the trenches 184 in the spacer 180 and the trenches 162 between the dielectric fins 160, in accordance with some embodiments. As shown in FIG. 2B-1, gaps G between the lower portion 115 and the channel nanostructure 114b and between the channel nanostructures 114b are formed after removing the sacrificial nanostructures 114a, in accordance with some embodiments.

As shown in FIG. 2B-2, through holes 156 are formed in the isolation structure 150 after removing the cladding layer 140, in accordance with some embodiments. The through holes 156 expose the isolation structure 130 thereunder, in accordance with some embodiments. The removal process includes an etching process, such as a wet etching process or a dry etching process, in accordance with some embodiments.

As shown in FIGS. 2C-1 and 2C-2, a gate dielectric layer 242 is conformally formed over the channel nanostructures 114b and the lower portion 115 of the fin structure 116 exposed by the trenches 184 in the spacer 180 and the trench 162 between the dielectric fins 160, in accordance with some embodiments.

The gate dielectric layer 242 is further conformally formed over the inner spacers 192, the spacer 180, the etch stop layer 220, the dielectric layer 230, the dielectric fins 160, the isolation structure 150, the isolation structure 130, and the lower portion 115 of the fin structure 116, in accordance with some embodiments.

The gate dielectric layer 242 is made of a dielectric material such as an oxide material (e.g., silicon oxide) or a high-K material, such as $HfO_2$, $ZrO_2$, $HfZrO_2$, or $Al_2O_3$, in accordance with some embodiments. The gate dielectric layer 242 is formed using a deposition process, such as a chemical vapor deposition process or a physical vapor deposition process, or another suitable process, in accordance with some embodiments.

As shown in FIGS. 2C-1 and 2C-2, a work function metal layer 244 is conformally formed over the gate dielectric layer 242 and in the trenches 184 and 162, in accordance with some embodiments. The work function metal layer 244 is made of titanium-containing material (e.g., TiN or TiSiN) or tantalum-containing material (e.g., TaN), or another suitable conductive material. The work function metal layer 244 is formed using an atomic layer deposition process, a chemical vapor deposition process, a physical vapor deposition process, or another suitable process.

As shown in FIGS. 2C-1 and 2C-2, a gate electrode layer 246 is formed over the work function metal layer 244, in accordance with some embodiments. The gate electrode layer 246 is made of W, Co, Al, TiAl, or another suitable conductive material. The gate electrode layer 246 is formed using a physical vapor deposition process, an atomic layer deposition process, or another suitable process.

As shown in FIGS. 2D-1 and 2D-2, portions of the gate dielectric layer 242, the work function metal layer 244, and the gate electrode layer 246 outside of the trenches 234 in the dielectric layer 230 and the etch stop layer 220 and the trenches 162 and top portions of the spacer 180, the etch stop layer 220, and the dielectric layer 230 are removed, in accordance with some embodiments. The removal process includes a planarization process such as a chemical mechanical polishing process, in accordance with some embodiments.

As shown in FIGS. 2D-1 and 2D-2, upper portions of the gate dielectric layer 242, the work function metal layer 244, the gate electrode layer 246, and the spacer 180 in the dielectric layer 230 are removed, in accordance with some embodiments.

After the removal process, in one of the trenches 234 and 162, the remaining gate dielectric layer 242, the remaining work function metal layer 244, and the remaining gate electrode layer 246 together form a gate stack 240, in accordance with some embodiments.

In some embodiments, a top surface 241 of the gate stack 240 is lower than the top surfaces 222 and 232 of the etch stop layer 220 and the dielectric layer 230. As shown in FIG. 2D-2, the top surface 241 of the gate stack 240 is substantially level with top surfaces 164 of the dielectric fins 160, in accordance with some embodiments.

The gate stack 240 is wrapped around the channel nanostructures 114b, in accordance with some embodiments. In some embodiments, a portion of the gate stack 240 is between the channel nanostructure 114b and the lower portion 115.

As shown in FIGS. 2E-1 and 2E-2, a conductive material layer 250a is formed in the trenches 234 and over the spacer 180, the etch stop layer 220, the dielectric layer 230, and the dielectric fins 160, in accordance with some embodiments. The conductive material layer 250a is used to reduce the contact resistance between contact structures formed thereon in subsequent processes and the gate stacks 240 thereunder, in accordance with some embodiments.

The conductive material layer 250a has a top portion 252, a sidewall portion 254, and a bottom portion 256, in accordance with some embodiments. The top portion 252 is over the top surfaces 222 and 232 of the etch stop layer 220 and the dielectric layer 230, in accordance with some embodiments. The sidewall portion 254 is over inner walls 234a of the trenches 234, in accordance with some embodiments. The bottom portion 256 is over the top surfaces 241 of the gate stacks 240, in accordance with some embodiments.

The sidewall portion 254 is thinner than the top portion 252, in accordance with some embodiments. That is, the thickness T254 of the sidewall portion 254 is less than the thickness T252 of the top portion 252, in accordance with some embodiments. The sidewall portion 254 is thinner than the bottom portion 256, in accordance with some embodiments. That is, the thickness T254 of the sidewall portion 254 is less than the thickness T256 of the bottom portion 256, in accordance with some embodiments.

The conductive material layer 250a is made of a conductive material such as metal (e.g., tungsten, aluminum, or TiAl), in accordance with some embodiments. The conductive material layer 250a is formed using an anisotropic deposition process such as a physical vapor deposition process, in accordance with some embodiments.

In the anisotropic deposition process, the deposition rate of the conductive material layer 250a over the horizontal surfaces (e.g., the top surfaces 222, 232 and 241 of the etch stop layer 220, the dielectric layer 230, and the gate stacks 240) is greater than the deposition rate of the conductive material layer 250a over the vertical surfaces (e.g., the inner walls 234a of the trenches 234), in accordance with some embodiments.

As shown in FIGS. 2F-1 and 2F-2, the sidewall portion 254 of the conductive material layer 250a is removed, in accordance with some embodiments. The removal process includes a dry etching process or a wet etching process, in accordance with some embodiments.

As shown in FIGS. 2F-1 and 2F-2, a cap material layer 260a is formed in the trenches 234 and over the conductive material layer 250a, in accordance with some embodiments. The cap material layer 260a has a top portion 262, a sidewall portion 264, and a bottom portion 266, in accordance with some embodiments.

The top portion 262 is over the top portion 252 of the conductive material layer 250a, in accordance with some embodiments. The sidewall portion 264 is over the inner walls 234a of the trenches 234, in accordance with some embodiments. The bottom portion 266 is over the bottom portion 256 of the conductive material layer 250a, in accordance with some embodiments.

The sidewall portion 264 is thinner than the top portion 262, in accordance with some embodiments. That is, the thickness T264 of the sidewall portion 264 is less than the thickness T262 of the top portion 262, in accordance with some embodiments. The thickness T262 ranges from about 1.5 nm to about 5 nm, in accordance with some embodiments.

The sidewall portion 264 is thinner than the bottom portion 266, in accordance with some embodiments. That is, the thickness T264 of the sidewall portion 264 is less than the thickness T266 of the bottom portion 266, in accordance with some embodiments. The thickness T266 ranges from about 1.5 nm to about 5 nm, in accordance with some embodiments.

The cap material layer 260a is made of metal oxide (e.g., $Al_2O_3$) or semiconductor oxide (e.g., $SiO_2$), in accordance with some embodiments. The cap material layer 260a is formed using a deposition process such as a physical vapor deposition process, a chemical vapor deposition process, or another suitable deposition process, in accordance with some embodiments.

As shown in FIGS. 2F-1 and 2F-2, a dopant D is formed in the top portion 262 and the bottom portion 266 of the cap material layer 260a, in accordance with some embodiments. The dopant D is able to reduce the etching rate of the top portion 262 and the bottom portion 266 of the cap material layer 260a, in accordance with some embodiments. In some embodiments, a concentration of the dopant D in the cap material layer 260a increases in a direction V away from the gate stack 240.

The dopant is made of nitrogen or another suitable material, which is different from that of the cap material layer 260a, in accordance with some embodiments. The formation process includes an ion implantation process such as a plasma process, in accordance with some embodiments. The gas used in the plasma process includes nitrogen, ammonia, or another suitable gas. The process temperature ranges from about 30° C. to about 200° C., in accordance with some embodiments.

As shown in FIGS. 2F-1, 2G-1, and 2G-2, the sidewall portion 264 of the cap material layer 260a is removed, which enlarges the space of the trenches 234, in accordance with some embodiments. The bottom portion 266 of the cap material layer 260a has a curved top surface 266a, in accordance with some embodiments.

The removal process includes an etching process such as a wet etching process or a dry etching process, in accordance with some embodiments. The etching solution includes ammonia and HF, in accordance with some embodiments.

The etching rate of the sidewall portion 264 is greater than the etching rate of the top portion 262 and the bottom portion 266, which are doped with the dopant D, in accordance with some embodiments. A ratio of the etching rate of the sidewall portion 264 to the etching rate of the top portion 262 and the bottom portion 266 ranges from about 1.5 to about 100, in accordance with some embodiments.

As shown in FIGS. 2H-1 and 2H-2, a bottom anti-reflection coating (BARC) layer 270 is formed over the bottom portion 266 of the cap material layer 260a over the gate stack 240, in accordance with some embodiments. The cap material layer 260a is able to improve the adhesion between the bottom anti-reflection coating layer 270 and the conductive material layer 250a, in accordance with some embodiments.

The bottom anti-reflection coating layer 270 is also referred to as a mask layer, in accordance with some embodiments. The bottom anti-reflection coating layer 270 includes a polymer material (such as a bottom anti-reflective coating material) or another suitable material.

As shown in FIGS. 2H-1 and 2H-2, a mask layer 280 is formed over the bottom anti-reflection coating layer 270, in accordance with some embodiments. The mask layer 280 includes a polymer material (such as a photoresist material), in accordance with some embodiments. The mask layer 280 includes a photoresist layer, in accordance with some embodiments.

The mask layer 280 is formed using a spin coating process and a photolithography process, in accordance with some embodiments. In some embodiments, the conductive material layer 250a, the cap material layer 260a, the bottom anti-reflection coating layer 270, and the mask layer 280 are made of different materials.

As shown in FIGS. 2H-1, 2I-1, and 2I-2, the top portion 262 of the cap material layer 260a, the bottom portion 266 of the cap material layer 260a over the dielectric fins 160, the top portion 252 of the conductive material layer 250a, and the bottom portion 256 of the conductive material layer 250a over the dielectric fins 160 are removed, in accordance with some embodiments. The remaining bottom portion 256 forms a conductive layer 250, in accordance with some embodiments. The remaining bottom portion 266 forms a cap layer 260, in accordance with some embodiments.

Since the bottom portion 266 of the cap material layer 260a (i.e., the cap layer 260) improves the adhesion between the bottom anti-reflection coating layer 270 and the bottom portion 256 of the conductive material layer 250a (i.e., the conductive layer 250), the conductive layer 250 is prevented from being damaged in the removal process, in accordance with some embodiments.

The conductive layer 250 is between the cap layer 260 and the gate stack 240, in accordance with some embodiments. The conductive layer 250 is between the cap layer 260 and the spacer 180, in accordance with some embodiments. The cap layer 260 has a curved top surface 266a, in accordance with some embodiments. In some embodiments, a concentration of the dopant D in the cap layer 260 increases in the direction V away from the gate stack 240.

The cap layer 260 has a central portion 261 and a peripheral portion 263 surrounding the central portion 261, in accordance with some embodiments. The peripheral portion 263 is thicker than the central portion 261, in accordance with some embodiments. The removal process includes an etching process such as a dry etching process or a wet etching process, in accordance with some embodiments.

As shown in FIGS. 2I-1 and 2I-2, the bottom anti-reflection coating layer 270 and the mask layer 280 are removed, in accordance with some embodiments. The cap layer 260 is used as a protective layer in the removal process, in accordance with some embodiments. The cap layer 260 protects the conductive layer 250 from being damaged during the removal process, in accordance with some embodiments. The removal process includes an ashing process, in accordance with some embodiments.

As shown in FIGS. 2J-1 and 2J-2, a protective layer 310 is formed over the cap layer 260 and in the trenches 234 of the dielectric layer 230 and the etch stop layer 220, in accordance with some embodiments. The protective layer 310 extends into the cap layer 260, in accordance with some embodiments.

Specifically, a lower portion 311 of the protective layer 310 is embedded in the cap layer 260, in accordance with some embodiments. The protective layer 310 is configured to prevent the gate stacks 240 from shorting contact structures formed subsequently, in accordance with some embodiments.

The cap layer 260 and the protective layer 310 are made of different materials, in accordance with some embodiments. In some embodiments, the cap layer 260 is used as an etch stop layer. The protective layer 310 is made of a dielectric material, such as silicon nitride or silicon carbide, in accordance with some embodiments. The protective layer 310 is formed using a chemical vapor deposition process or another suitable process.

As shown in FIGS. 2J-1 and 2J-2, a mask layer 320 is formed over the protective layer 310, in accordance with some embodiments. The mask layer 320 has openings 322 exposing the protective layer 310 thereunder, in accordance with some embodiments. The openings 322 are over the trenches 234 and the gate stacks 240, in accordance with some embodiments.

The mask layer 320 is made of a polymer material (such as a photoresist material), in accordance with some embodiments. The mask layer 320 includes a photoresist layer, in accordance with some embodiments. The mask layer 320 is formed using a spin coating process and a photolithography process, in accordance with some embodiments.

As shown in FIGS. 2K-1 and 2K-2, portions of the protective layer 310 are removed through the openings 322 of the mask layer 320 to form through holes 312 in the protective layer 310, in accordance with some embodiments. The through holes 312 expose the cap layer 260, in accordance with some embodiments.

The cap layer 260 is used as an etch stop layer, which prevents the conductive layer 250 from being over-etched, in accordance with some embodiments. Therefore, the yield of the removal process is improved, in accordance with some embodiments. The contact resistance between the conductive layer 250 and contact structures subsequently formed thereon is reduced, in accordance with some embodiments. The removal process includes an etching process (e.g., a dry etching process), in accordance with some embodiments.

As shown in FIGS. 2L-1 and 2L-2, portions of the cap layer 260 are removed through the through holes 312 of the protective layer 310 to form through holes 265 in the cap layer 260, in accordance with some embodiments. The through holes 265 expose the conductive layer 250, in accordance with some embodiments. The removal process includes an etching process (e.g., a dry etching process), in accordance with some embodiments.

As shown in FIGS. 2M-1 and 2M-2, a contact material layer 330a is formed over the mask layer 320 to fill into the through holes 312 and 265 of the protective layer 310 and the cap layer 260 and the openings 322 of the mask layer 320, in accordance with some embodiments. The contact material layer 330a is made of, for example, tungsten or another suitable conductive material. The formation of the contact material layer 330a includes performing a physical vapor deposition process, a chemical vapor deposition process, or another suitable process.

As shown in FIGS. 2M-1, 2N-1, and 2N-2, upper portions of the contact material layer 330a outside of the through holes 312 (of the protective layer 310), the mask layer 320, and the protective layer 310 outside of the through holes 312 are removed, in accordance with some embodiments. The contact material layer 330a remaining in one of the through holes 312 forms a contact structure 330, in accordance with some embodiments. The contact structure 330 passes through the protective layer 310 and the cap layer 260, in accordance with some embodiments.

The protective layer 310 has a central portion 314 and a peripheral portion 316 surrounding the central portion 314, in accordance with some embodiments. The peripheral portion 316 is thinner than the central portion 314, in accordance with some embodiments. The contact structure 330 passes through the central portion 314, in accordance with some embodiments.

In some embodiments, a sidewall 267 of the cap layer 260 is substantially aligned with a sidewall 318 of the protective layer 310. The sidewall 267 of the cap layer 260 is connected between the sidewall 318 of the protective layer 310 and a sidewall 251 of the conductive layer 250, in accordance with some embodiments. The cap layer 260 is thinner than the protective layer 310, in accordance with some embodiments.

The spacer 180 surrounds the gate stack 240, the conductive layer 250, the cap layer 260, the lower portion 311 of the protective layer 310, and lower portions 332 of the contact structures 330, in accordance with some embodiments. The conductive layer 250 is connected between the contact structure 330 thereover and the gate stack 240 thereunder, in accordance with some embodiments.

In accordance with some embodiments, semiconductor device structures and methods for forming the same are provided. The methods (for forming the semiconductor device structure) form a cap layer over a gate stack. The cap layer is used as an adhesive layer. The cap layer is able to improve the adhesion between the gate stack and a bottom anti-reflection coating layer subsequently formed thereon, which prevents the gate stack from being damaged in a subsequent etching process. The cap layer is used as an etch stop layer, which protects the gate stack from over etching damage caused by a subsequent etching process.

In accordance with some embodiments, a semiconductor device structure is provided. The semiconductor device structure includes a substrate. The semiconductor device structure includes a gate stack over the substrate. The semiconductor device structure includes a cap layer over the gate stack. The semiconductor device structure includes a protective layer over the cap layer, wherein a lower portion of the protective layer extends into the cap layer. The semiconductor device structure includes a contact structure passing through the protective layer and the cap layer.

In accordance with some embodiments, a semiconductor device structure is provided. The semiconductor device structure includes a substrate. The semiconductor device structure includes a gate stack over the substrate. The semiconductor device structure includes a cap layer over the gate stack, wherein a concentration of a dopant in the cap layer increases in a direction away from the gate stack. The semiconductor device structure includes a protective layer over the cap layer. The semiconductor device structure includes a contact structure passing through the protective layer and the cap layer.

In accordance with some embodiments, a method for forming a semiconductor device structure is provided. The method includes forming a dielectric layer over a substrate. The dielectric layer has a trench. The method includes forming a gate stack in the trench, wherein a first top surface of the gate stack is lower than a second top surface of the dielectric layer. The method includes forming a cap layer over the gate stack and in the trench. The method includes forming a protective layer over the cap layer, wherein a lower portion of the protective layer is embedded in the cap layer. The method includes forming a first through hole in the protective layer. The method includes forming a second through hole in the cap layer and under the first through hole. The method includes forming a contact structure in the first through hole and the second through hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a dielectric layer over a substrate, wherein the dielectric layer has a trench;
forming a gate stack in the trench, wherein a first top surface of the gate stack is lower than a second top surface of the dielectric layer;
forming a cap layer over the gate stack and in the trench;
forming a protective layer over the cap layer, wherein a lower portion of the protective layer is embedded in the cap layer;
forming a first through hole in the protective layer;
forming a second through hole in the cap layer and under the first through hole; and
forming a contact structure in the first through hole and the second through hole.

2. The method for forming the semiconductor device structure as claimed in claim 1, wherein the forming of the cap layer over the gate stack and in the trench comprises:

forming a cap material layer in the trench, wherein the cap material layer has a sidewall portion and a bottom portion, the sidewall portion is over an inner wall of the trench, and the bottom portion is over a first top surface of the gate stack;
forming a dopant in the bottom portion; and
removing the sidewall portion.

3. The method for forming the semiconductor device structure as claimed in claim 2, wherein the cap material layer is further formed over the second top surface of the dielectric layer, and the method further comprises:

forming a mask layer over the bottom portion of the cap material layer after removing the sidewall portion of the cap material layer;
removing the cap material layer over the second top surface of the dielectric layer; and
removing the mask layer.

4. The method for forming the semiconductor device structure as claimed in claim 1, further comprising:

forming a conductive layer over the gate stack before forming the cap layer over the gate stack and in the trench, wherein the cap layer is formed over the conductive layer.

5. The method for forming the semiconductor device structure as claimed in claim 4, wherein the forming of the conductive layer over the gate stack comprises:

forming a conductive material layer in the trench, wherein the conductive material layer has a sidewall portion and a bottom portion, the sidewall portion is over an inner wall of the trench, the bottom portion is over a top surface of the gate stack, and the sidewall portion is thinner than the bottom portion; and
removing the sidewall portion.

6. The method for forming the semiconductor device structure as claimed in claim 1, wherein the protective layer has a central portion and a peripheral portion surrounding the central portion, and the peripheral portion is thinner than the central portion.

7. The method for forming the semiconductor device structure as claimed in claim 6, wherein the contact structure passes through the central portion of the protective layer.

8. The method for forming the semiconductor device structure as claimed in claim 1, wherein a first sidewall of the cap layer is substantially aligned with a second sidewall of the protective layer.

9. The method for forming the semiconductor device structure as claimed in claim 1, wherein the cap layer and the protective layer are made of different materials.

10. The method for forming the semiconductor device structure as claimed in claim 1, wherein the cap layer is thinner than the protective layer.

11. A method for forming a semiconductor device structure, comprising:
   forming a dielectric layer over a substrate, wherein the dielectric layer has a trench;
   forming a gate stack in the trench, wherein a first top surface of the gate stack is lower than a second top surface of the dielectric layer;
   forming a cap layer over the gate stack and in the trench, wherein a concentration of a dopant in the cap layer increases in a direction away from the gate stack;
   forming a protective layer over the cap layer; and
   forming a contact structure passing through the protective layer and the cap layer.

12. The method for forming the semiconductor device structure as claimed in claim 11, wherein the cap layer has a curved top surface.

13. The method for forming the semiconductor device structure as claimed in claim 11, wherein the dopant comprises nitrogen.

14. The method for forming the semiconductor device structure as claimed in claim 11, further comprising:
   forming a conductive layer over the gate stack before forming the cap layer over the gate stack and in the trench, wherein the cap layer is formed over the conductive layer.

15. The method for forming the semiconductor device structure as claimed in claim 14, wherein the conductive layer is between the contact structure and the gate stack.

16. A method for forming a semiconductor device structure, comprising:
   forming a dielectric layer over a substrate, wherein the dielectric layer has a trench;
   forming a gate stack in the trench, wherein a first top surface of the gate stack is lower than a second top surface of the dielectric layer;
   forming a conductive layer over the gate stack and in the trench;
   forming a cap layer over the conductive layer and in the trench;
   forming a protective layer over the cap layer and in the trench, wherein the conductive layer, the cap layer, and the protective layer are made of different materials, and a first sidewall of the cap layer is connected between a second sidewall of the protective layer and a third sidewall of the conductive layer; and
   forming a contact structure passing through the protective layer and the cap layer.

17. The method for forming the semiconductor device structure as claimed in claim 16, wherein the conductive layer separates the contact structure from the gate stack.

18. The method for forming the semiconductor device structure as claimed in claim 16, wherein the cap layer comprises metal oxide or semiconductor oxide.

19. The method for forming the semiconductor device structure as claimed in claim 18, wherein the cap layer further comprises nitrogen.

20. The method for forming the semiconductor device structure as claimed in claim 16, wherein a width of the conductive layer decreases toward the gate stack.

* * * * *